(12) United States Patent
Gorrell et al.

(10) Patent No.: US 7,361,916 B2
(45) Date of Patent: Apr. 22, 2008

(54) COUPLED NANO-RESONATING ENERGY EMITTING STRUCTURES

(75) Inventors: Jonathan Gorrell, Gainesville, FL (US); Mark Davidson, Gainesville, FL (US); Michael E. Maines, Gainesville, FL (US)

(73) Assignee: Virgin Islands Microsystems, Inc., St. Thomas, VI (US)

( * ) Notice: Subject to any disclaimer, the term of this patent is extended or adjusted under 35 U.S.C. 154(b) by 350 days.

(21) Appl. No.: 11/302,471

(22) Filed: Dec. 14, 2005

(65) Prior Publication Data
US 2007/0075265 A1  Apr. 5, 2007

Related U.S. Application Data

(63) Continuation-in-part of application No. 11/243,477, filed on Oct. 5, 2005, and a continuation-in-part of application No. 11/238,991, filed on Sep. 30, 2005.

(51) Int. Cl.
*G01K 1/08* (2006.01)
*A61N 5/06* (2006.01)

(52) U.S. Cl. .................. 250/494.1; 250/493.1; 250/492.24; 250/400; 250/504 R; 977/950; 977/949; 977/954; 343/786; 438/706

(58) Field of Classification Search .............. None
See application file for complete search history.

(56) References Cited

U.S. PATENT DOCUMENTS

| | | | |
|---|---|---|---|
| 1,948,384 A | 2/1934 | Lawrence | |
| 2,307,086 A | 1/1943 | Varian et al. | |
| 2,431,396 A | 11/1947 | Hansell | |
| 2,473,477 A | 6/1949 | Smith | |
| 2,634,372 A | 4/1953 | Salisbury | |
| 2,932,798 A | 4/1960 | Kerst et al. | |
| 3,571,642 A | 3/1971 | Westcott | |
| 3,761,828 A | 9/1973 | Pollard et al. | |
| 3,923,568 A | 12/1975 | Bersin | |
| 3,989,347 A | 11/1976 | Eschler | |
| 4,282,436 A | 8/1981 | Kapetanakos et al. | |

(Continued)

FOREIGN PATENT DOCUMENTS

EP  0237559 B1  12/1991

(Continued)

OTHER PUBLICATIONS

International Search Report and Written Opinion mailed Nov. 23, 2007 in International Application No. PCT/US2006/022786.

(Continued)

*Primary Examiner*—Jack Berman
*Assistant Examiner*—Zia R. Hashmi
(74) *Attorney, Agent, or Firm*—Davidson Berquist Jackson & Gowdey LLP

(57) ABSTRACT

A coupled nano-resonating structure includes a plurality of a nano-resonating substructures constructed and adapted to couple energy from a beam of charged particles into said nano-resonating structure and to transmit the coupled energy outside said nano-resonating structure. The nano-resonant substructures may have various shapes and may include parallel rows of structures. The rows may be symmetric or asymmetric, tilted, and/or staggered.

27 Claims, 23 Drawing Sheets

U.S. PATENT DOCUMENTS

| | | |
|---|---|---|
| 4,482,779 A | 11/1984 | Anderson |
| 4,727,550 A | 2/1988 | Chang et al. |
| 4,740,973 A | 4/1988 | Madey |
| 4,746,201 A | 5/1988 | Gould |
| 4,829,527 A | 5/1989 | Wortman et al. |
| 4,838,021 A | 6/1989 | Beattie |
| 5,023,563 A | 6/1991 | Harvey et al. |
| 5,157,000 A | 10/1992 | Elkind et al. |
| 5,163,118 A | 11/1992 | Lorenzo et al. |
| 5,185,073 A | 2/1993 | Bindra |
| 5,199,918 A | 4/1993 | Kumar |
| 5,262,656 A | 11/1993 | Blondeau et al. |
| 5,263,043 A | 11/1993 | Walsh |
| 5,268,693 A | 12/1993 | Walsh |
| 5,268,788 A | 12/1993 | Fox et al. |
| 5,302,240 A | 4/1994 | Hori et al. |
| 5,354,709 A | 10/1994 | Lorenzo et al. |
| 5,446,814 A | 8/1995 | Kuo et al. |
| 5,608,263 A | 3/1997 | Drayton et al. |
| 5,668,368 A | 9/1997 | Sakai et al. |
| 5,705,443 A | 1/1998 | Stauf et al. |
| 5,737,458 A | 4/1998 | Wojnarowski et al. |
| 5,744,919 A | 4/1998 | Mishin et al. |
| 5,757,009 A | 5/1998 | Walstrom |
| 5,767,013 A | 6/1998 | Park |
| 5,790,585 A | 8/1998 | Walsh |
| 5,811,943 A | 9/1998 | Mishin et al. |
| 5,821,836 A | 10/1998 | Katehi et al. |
| 5,821,902 A | 10/1998 | Keen |
| 5,831,270 A | 11/1998 | Nakasuji |
| 5,847,745 A | 12/1998 | Shimizu et al. |
| 5,889,449 A | 3/1999 | Fiedziuszko |
| 5,902,489 A | 5/1999 | Yasuda et al. |
| 6,008,496 A | 12/1999 | Winefordner et al. |
| 6,040,625 A | 3/2000 | Ip |
| 6,060,833 A | 5/2000 | Velazco |
| 6,080,529 A | 6/2000 | Ye et al. |
| 6,195,199 B1 | 2/2001 | Yamada |
| 6,222,866 B1 | 4/2001 | Seko |
| 6,281,769 B1 | 8/2001 | Fiedziuszko |
| 6,297,511 B1 | 10/2001 | Syllaios et al. |
| 6,338,968 B1 | 1/2002 | Hefti |
| 6,370,306 B1 | 4/2002 | Sato et al. |
| 6,373,194 B1 | 4/2002 | Small |
| 6,376,258 B2 | 4/2002 | Hefti |
| 6,407,516 B1 | 6/2002 | Victor |
| 6,441,298 B1 | 8/2002 | Thio |
| 6,504,303 B2 | 1/2003 | Small |
| 6,545,425 B2 | 4/2003 | Victor |
| 6,577,040 B2 | 6/2003 | Nguyen |
| 6,603,915 B2 | 8/2003 | Glebov et al. |
| 6,624,916 B1 | 9/2003 | Green et al. |
| 6,636,653 B2 | 10/2003 | Miracky et al. |
| 6,642,907 B2 | 11/2003 | Hamada et al. |
| 6,738,176 B2 | 5/2004 | Rabinowitz et al. |
| 6,741,781 B2 | 5/2004 | Furuyama |
| 6,782,205 B2 | 8/2004 | Trisnadi et al. |
| 6,791,438 B2 | 9/2004 | Takahashi et al. |
| 6,829,286 B1 | 12/2004 | Guilfoyle et al. |
| 6,834,152 B2 | 12/2004 | Gunn et al. |
| 6,870,438 B1 | 3/2005 | Shino et al. |
| 6,885,262 B2 | 4/2005 | Nishimura et al. |
| 6,909,092 B2 | 6/2005 | Nagahama |
| 6,909,104 B1 | 6/2005 | Koops |
| 6,944,369 B2 | 9/2005 | Deliwala |
| 6,953,291 B2 | 10/2005 | Liu |
| 6,965,625 B2 | 11/2005 | Mross et al. |
| 6,995,406 B2 | 2/2006 | Tojo et al. |
| 7,010,183 B2 | 3/2006 | Estes et al. |
| 7,092,588 B2 | 8/2006 | Kondo |
| 7,092,603 B2 | 8/2006 | Glebov et al. |
| 7,122,978 B2 | 10/2006 | Nakanishi et al. |
| 7,177,515 B2 | 2/2007 | Estes et al. |
| 2001/0025925 A1 | 10/2001 | Abe et al. |
| 2002/0009723 A1 | 1/2002 | Hefti |
| 2002/0027481 A1 | 3/2002 | Fiedziuszko |
| 2002/0053638 A1 | 5/2002 | Winkler et al. |
| 2002/0135665 A1 | 9/2002 | Gardner |
| 2003/0012925 A1 | 1/2003 | Gorrell |
| 2003/0016412 A1 | 1/2003 | Small |
| 2003/0016421 A1 | 1/2003 | Small |
| 2003/0034535 A1 | 2/2003 | Barenburu et al. |
| 2003/0155521 A1 | 8/2003 | Feuerbaum |
| 2003/0164947 A1 | 9/2003 | Vaupel |
| 2003/0179974 A1 | 9/2003 | Estes et al. |
| 2003/0206708 A1 | 11/2003 | Estes et al. |
| 2004/0061053 A1 | 4/2004 | Taniguchi et al. |
| 2004/0108473 A1 | 6/2004 | Melnychuk et al. |
| 2004/0136715 A1 | 7/2004 | Kondo |
| 2004/0150991 A1 | 8/2004 | Ouderkirk et al. |
| 2004/0171272 A1 | 9/2004 | Jin et al. |
| 2004/0180244 A1 | 9/2004 | Tour et al. |
| 2004/0213375 A1 | 10/2004 | Bjorkholm et al. |
| 2004/0217297 A1 | 11/2004 | Moses et al. |
| 2004/0231996 A1 | 11/2004 | Webb |
| 2004/0264867 A1 | 12/2004 | Kondo |
| 2005/0023145 A1 | 2/2005 | Cohen et al. |
| 2005/0054151 A1 | 3/2005 | Lowther et al. |
| 2005/0067286 A1 | 3/2005 | Ahn et al. |
| 2005/0082469 A1 | 4/2005 | Carlo |
| 2005/0092929 A1 | 5/2005 | Schneiker |
| 2005/0105690 A1 | 5/2005 | Pau et al. |
| 2005/0145882 A1 | 7/2005 | Taylor et al. |
| 2005/0162104 A1 | 7/2005 | Victor et al. |
| 2005/0190637 A1 | 9/2005 | Ichimura et al. |
| 2005/0194258 A1 | 9/2005 | Cohen et al. |
| 2005/0201707 A1 | 9/2005 | Glebov et al. |
| 2005/0201717 A1 | 9/2005 | Matsumura et al. |
| 2005/0212503 A1 | 9/2005 | Deibele |
| 2005/0249451 A1 | 11/2005 | Baehr-Jones et al. |
| 2006/0007730 A1 | 1/2006 | Nakamura et al. |
| 2006/0018619 A1 | 1/2006 | Helffrich et al. |
| 2006/0035173 A1 | 2/2006 | Davidson et al. |
| 2006/0045418 A1 | 3/2006 | Cho et al. |
| 2006/0060782 A1 | 3/2006 | Khursheed |
| 2006/0062258 A1 | 3/2006 | Brau et al. |
| 2006/0159131 A1 | 7/2006 | Liu et al. |
| 2006/0164496 A1 | 7/2006 | Tokutake et al. |
| 2006/0216940 A1 | 9/2006 | Gorrell et al. |
| 2007/0003781 A1 | 1/2007 | de Rochemont |
| 2007/0013765 A1 | 1/2007 | Hudson et al. |
| 2007/0075264 A1 | 4/2007 | Gorrell et al. |
| 2007/0086915 A1 | 4/2007 | LeBoeuf et al. |
| 2007/0116420 A1 | 5/2007 | Estes et al. |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

Search Report and Written Opinion mailed Oct. 25, 2007 in PCT Appln. No. PCT/US2006/022687.

Search Report and Written Opinion mailed Oct. 26, 2007 in PCT Appln. No. PCT/US2006/022675.
Search Report and Written Opinion mailed Sep. 21, 2007 in PCT Appln. No. PCT/US2006/022688.
Search Report and Written Opinion mailed Sep. 25, 2007 in PCT appln. No. PCT/US2006/022681.
Search Report and Written Opinion mailed Sep. 26, 2007 in PCT Appln. No. PCT/US2006/024218.
Search Report and Written Opinion mailed Aug. 24, 2007 in PCT Appln. No. PCT/US2006/022768.
Search Report and Written Opinion mailed Aug. 31, 2007 in PCT Appln. No. PCT/US2006/022680.
Search Report and Written Opinion mailed Jul. 16, 2007 in PCT Appln. No. PCT/US2006/022774.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jun. 20, 2007 in PCT Appln. No. PCT/US2006/022779.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022787.
Search Report and Written Opinion mailed Sep. 5, 2007 in PCT Appln. No. PCT/US2006/027428.
Search Report and Written Opinion mailed Sep. 17, 2007 in PCT Appln. No. PCT/US2006/022689.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Markoff, John, "A Chip That Can Transfer Data Using Laser Light," The New York Times, Sep. 18, 2006.
S.M. Sze, "Semiconductor Devices Physics and Technology", 2nd Edition, Chapters 9 and 12, Copyright 1985, 2002.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.
Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Mar. 7, 2007 in PCT Appln. No. PCT/US2006/022775.
Speller et al., "A Low-Noise MEMS Accelerometer for Unattended Ground Sensor Applications", Applied MEMS Inc., 12200 Parc Crest, Stafford, TX, USA 77477.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
"Array of Nanoklystrons for Frequency Agility or Redundancy," NASA's Jet Propulsion Laboratory, NASA Tech Briefs, NPO-21033. 2001.
"Hardware Development Programs," Calabazas Creek Research, Inc. found at http://calcreek.com/hardware.html.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Alford, T.L. et al., "Advanced silver-based metallization patterning for ULSI applications," Microelectronic Engineering 55, 2001, pp. 383-388, Elsevier Science B.V.

Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Electron Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.
Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.
Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.
Chuang, S.L. et al., "Smith-Purcell Radiation from a Charge Moving Above a Penetrable Grating," IEEE MTT-S Digest, 1983, pp. 405-406, IEEE.
Far-IR, Sub-MM & MM Detector Technology Workshop list of manuscripts, session 6 2002.
Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.
Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.
Gallerano, G.P. et al., "Overview of Terahertz Radiation Sources," Proceedings of the 2004 FEL Conference, pp. 216-221.
Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.
Gover, A. et al., "Angular Radiation Pattern of Smith-Purcell Radiation," Journal of the Optical Society of America, Oct. 1984, pp. 723-728, vol. 1 No. 5, Optical Society of America.
Grishin, Yu. A. et al., "Pulsed Orotron—A New Microwave Source for Submillimeter Pulse High -Field Electron Paramagnetic Resonance Spectroscopy," Review of Scientific Instruments, Sep. 2004, pp. 2926-2936, vol. 75 No. 9, American Institute of Physics.
Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.
Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.
Ives, Lawrence et al., "Development of Backward Wave Oscillators for Terahertz Applications," Terahertz for Military and Security Applications, Proceedings of SPIE vol. 5070 (2003), pp. 71-82.
Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smith-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara_poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Technol. B. 17 (5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Phototonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

Mokhoff, Nicolas, "Optical-speed light detector promises fast space talk," EETimes Online, Mar. 20, 2006, from website: www.eetimes.com/showArticle.jhtml?articleID=183701047.

S. Hoogland et al., "A solution-processed 1.53 μm quantum dot laser with temperature-invariant emission wavelength," Optics Express, vol. 14, No. 8, Apr. 17, 2006, pp. 3273-3281.

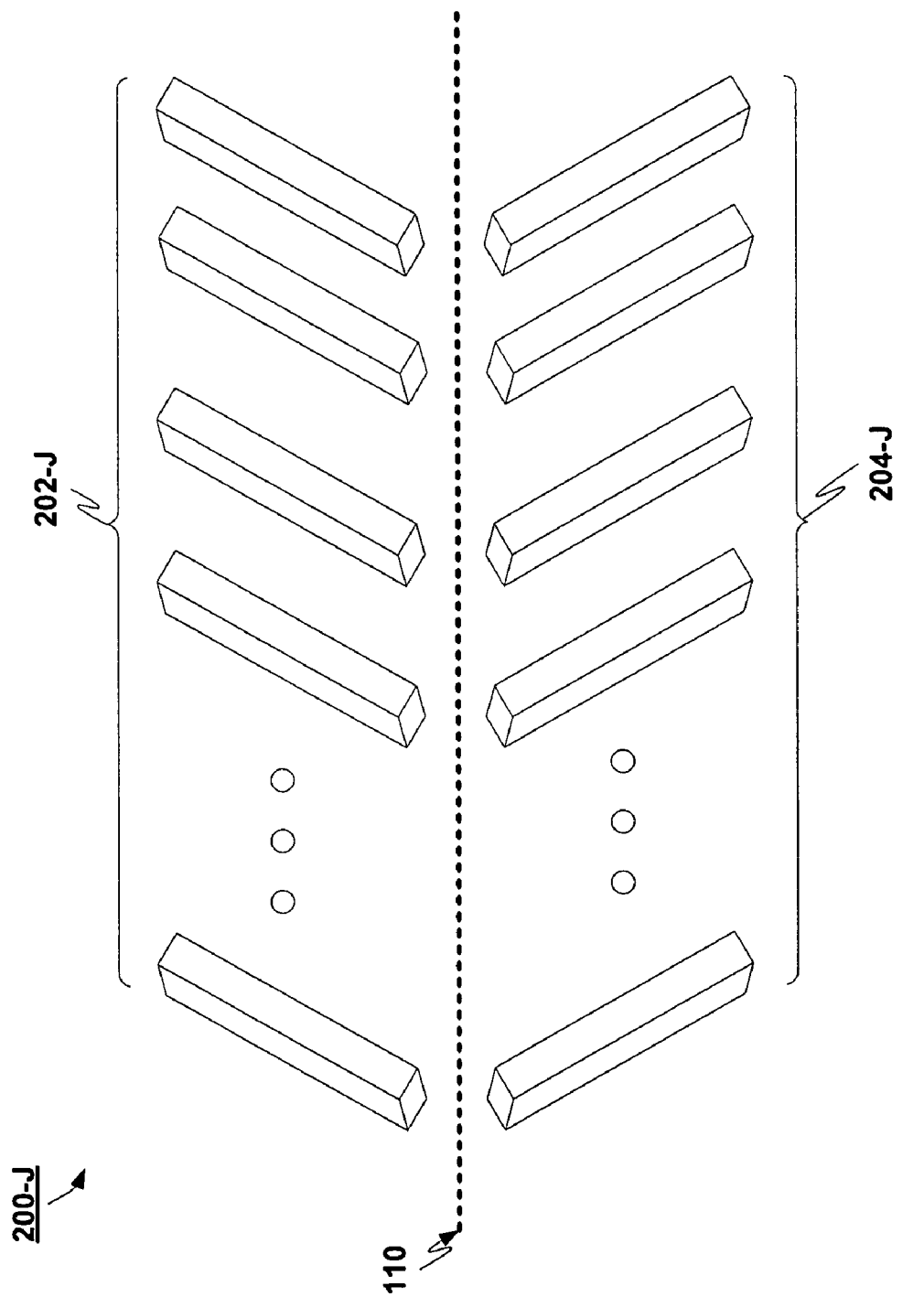

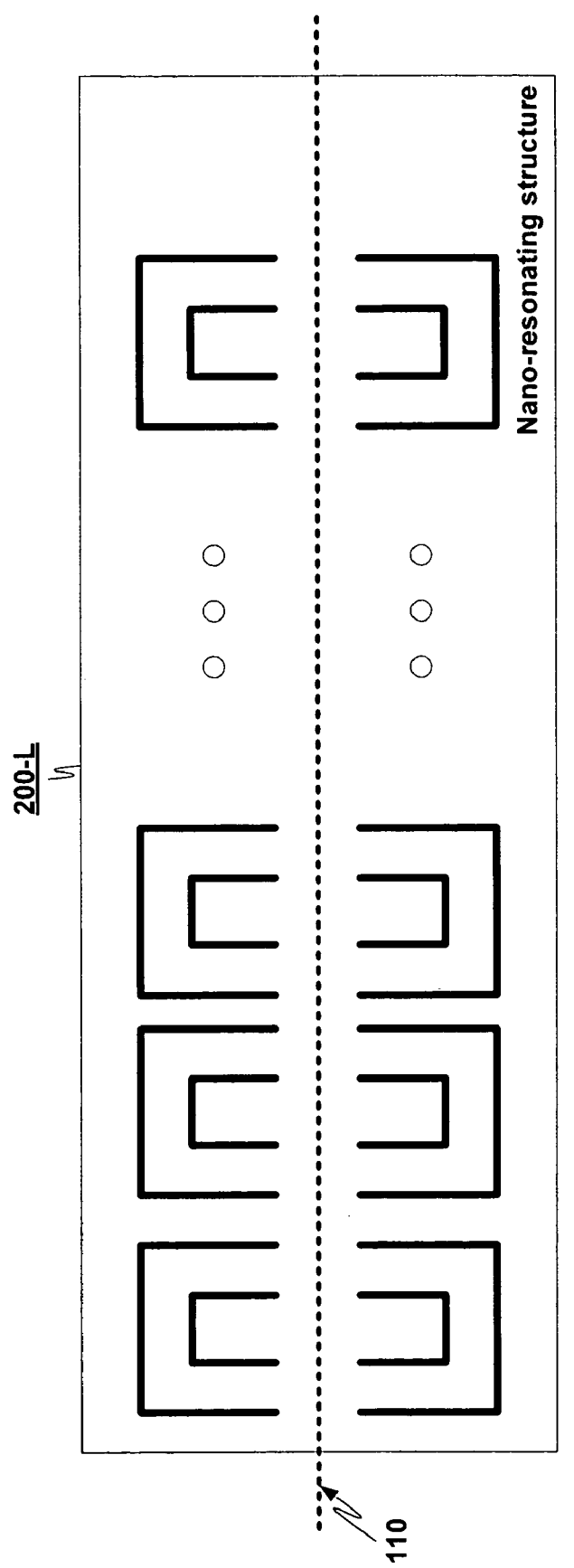
Fig. 3(ℓ)

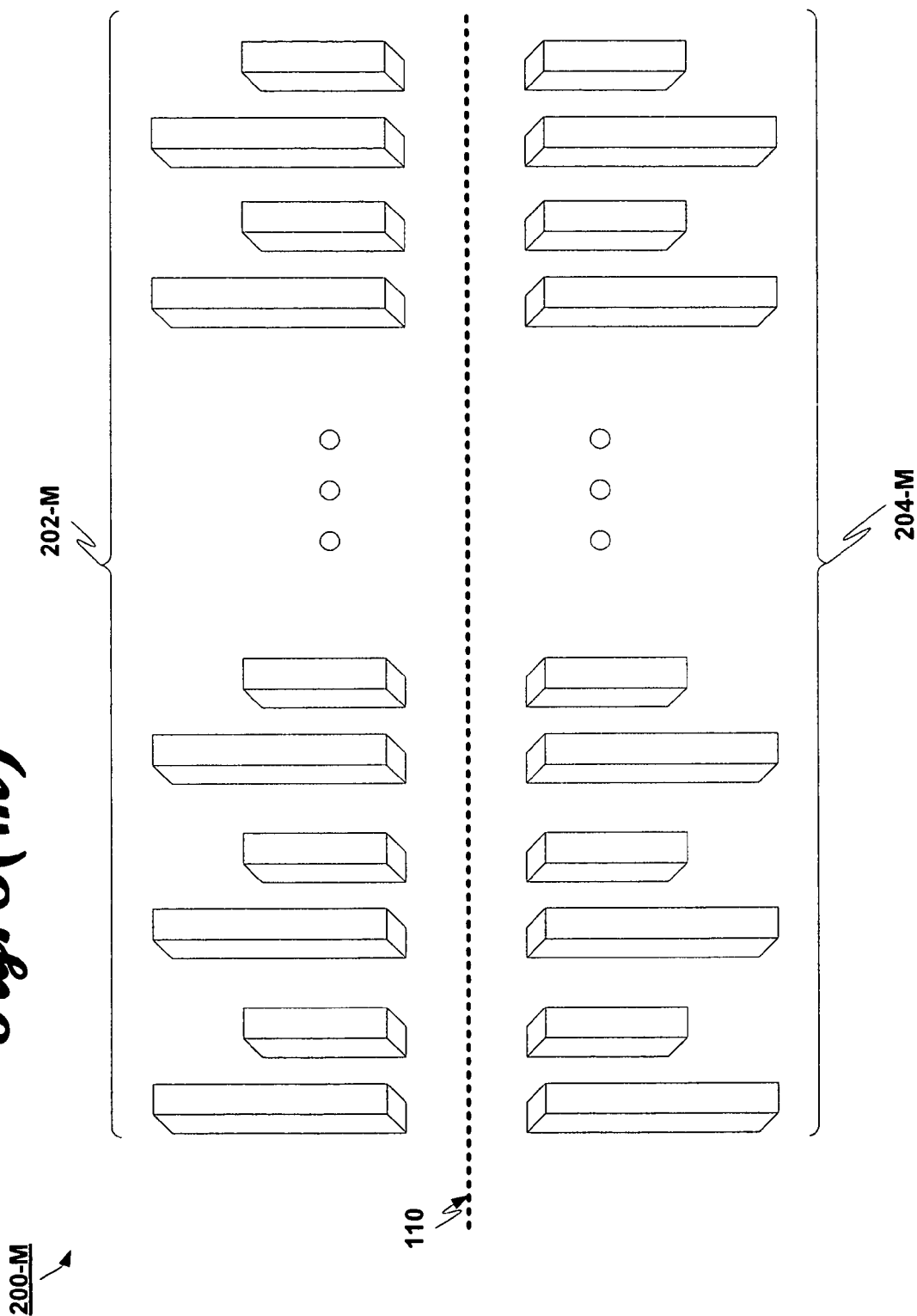

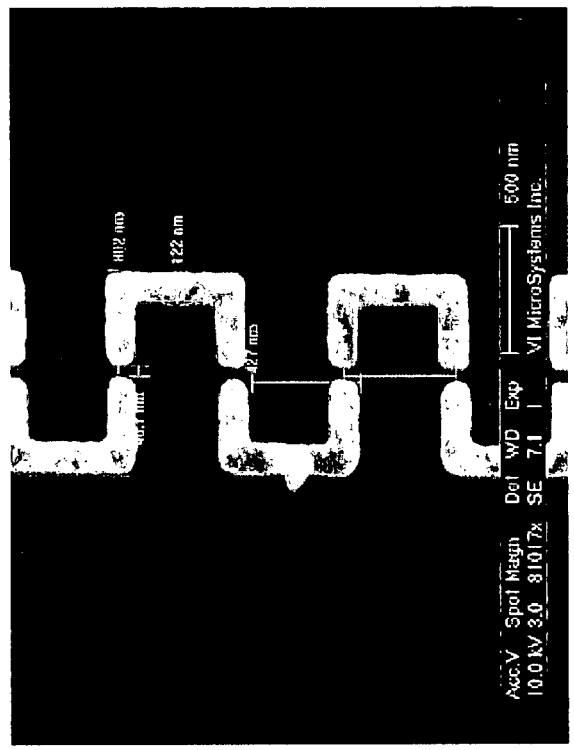
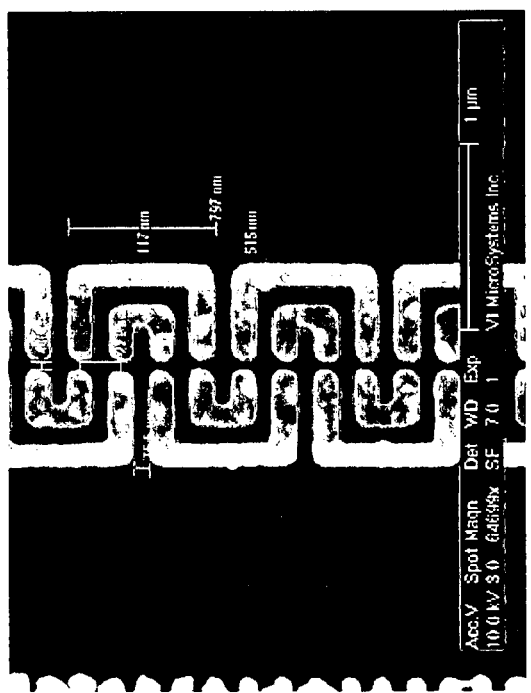
Fig. 6(a)
Fig. 6(b)

COUPLED NANO-RESONATING ENERGY EMITTING STRUCTURES

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

CROSS-REFERENCE TO CO-PENDING APPLICATIONS

The present invention is related to and claims priority from the following co-pending U.S. Patent applications: (1) U.S. patent application Ser. No. 11/238,991, entitled "Ultra-Small Resonating Charged Particle Beam Modulator," and filed Sep. 30, 2005, and (2) U.S. application Ser. No. 11/243,477, entitled "Electron beam induced resonance," filed on Oct. 5, 2005, the entire contents of both of which are incorporated herein by reference.

The present invention is related to the following co-pending U.S. Patent applications: (1) U.S. patent application Ser. No. 10/917,511, filed on Aug. 13, 2004, entitled "Patterning Thin Metal Film by Dry Reactive Ion Etching," and to U.S. application Ser. No. 11/203,407, filed on Aug. 15, 2005, entitled "Method Of Patterning Ultra-Small Structures," (2) U.S. application Ser. No. 11/243,476, entitled "Structures And Methods For Coupling Energy From An Electromagnetic Wave," filed on Oct. 5, 2005; which are both commonly owned with the present application, the entire contents of each of which are incorporated herein by reference.

FIELD OF THE DISCLOSURE

This disclosure relates to electromagnetic radiation devices, and particularly to ultra-small resonant structures.

INTRODUCTION

A multitude of applications exist for electromagnetic radiating devices. A few such devices emit radiation at frequencies spanning the infrared, visible, and ultra-violet spectrums. A subgroup (being the majority) of such devices are constructed using semiconductor-based technologies (light emitting diodes and the like), and are considered small (on the order of millimeters in dimension).

The devices of the present invention produce electromagnetic radiation by the excitation of ultra-small resonant structures. The resonant excitation in a device according to the invention is induced by electromagnetic interaction which is caused, e.g., by the passing of a charged particle beam in close proximity to the device. The charged particle beam can include ions (positive or negative), electrons, protons and the like. The beam may be produced by any source, including, e.g., without limitation an ion gun, a tungsten filament, a cathode, a planar vacuum triode, an electron-impact ionizer, a laser ionizer, a chemical ionizer, a thermal ionizer, an ion-impact ionizer.

Glossary

As used throughout this document:

The phrase "ultra-small resonant structure" shall mean any structure of any material, type or microscopic size that by its characteristics causes electrons to resonate at a frequency in excess of the microwave frequency.

The term "ultra-small" within the phrase "ultra-small resonant structure" shall mean microscopic structural dimensions and shall include so-called "micro" structures, "nano" structures, or any other very small structures that will produce resonance at frequencies in excess of microwave frequencies.

DESCRIPTION OF PRESENTLY PREFERRED EXAMPLES OF THE INVENTION

Brief Description of Figures

The invention is better understood by reading the following detailed description with reference to the accompanying drawings in which:

FIGS. 4(a)-4(d), 5(a)-5(e) and 6(a)-6(d) are microscopic photographs of series of exemplary structures according to embodiments of the present invention.

DESCRIPTION

Figure 1:
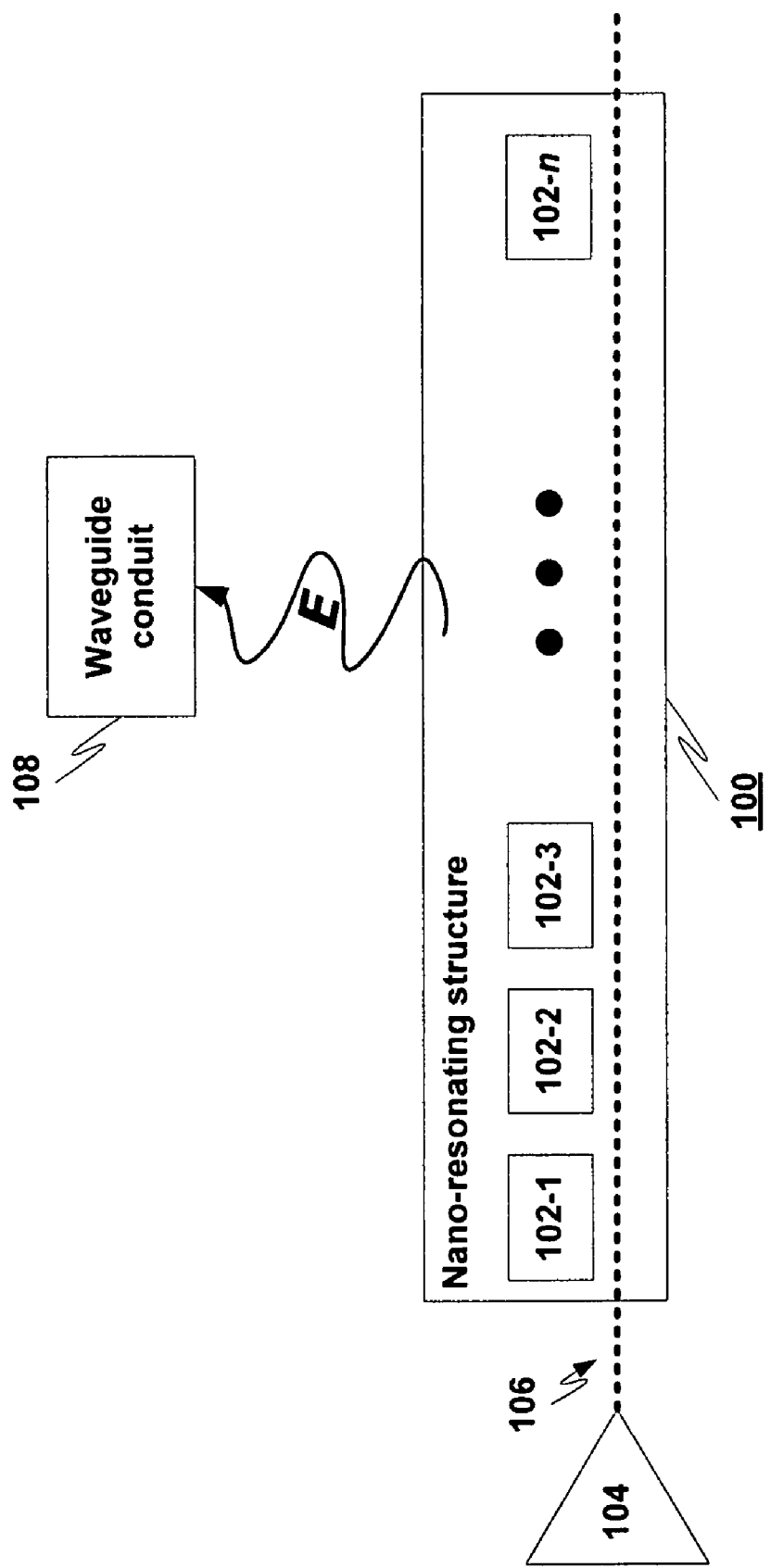
FIGS. 1-2 are schematic views of coupled nano-resonating energy emitting structures according to embodiments of the present invention.

As shown in FIG. 1, a nano-resonating energy emitting structure 100 according to embodiments of the present invention consists of a number of component substructures 102-1, 102-2, 102-3, . . . , 102-n. A source 104 of charged particles produces a beam 106 consisting of one or more charged particles. The charged particles of beam 106 may consist of electrons, protons or ions.

The charged particle beam can include ions (positive or negative), electrons, protons and the like. Many well-known means and methods exist to produce a charged particle beam. The beam may be produced by any source, including, e.g., without limitation an ion gun, a tungsten filament, a cathode, a planar vacuum triode, an electron-impact ionizer, a laser ionizer, a chemical ionizer, a thermal ionizer, an ion-impact ionizer.

In operation, the beam 106 passes in proximity to nano-resonating structure 100, causing the component substructures 102-1, 102-2, 102-3, . . . , 102-n of the structure to resonate and thereby to produce electromagnetic radiation (denoted E in the drawing). Electromagnetic radiation may be coupled out of nano-resonating structure 100, e.g., to some other structure. For example, the electromagnetic radiation may be coupled to an electromagnetic wave via a waveguide conduit 108 positioned in the proximity of nano-resonating structure 100. The waveguide conduit may be, for example, an optical fiber or the like.

Figure 2:
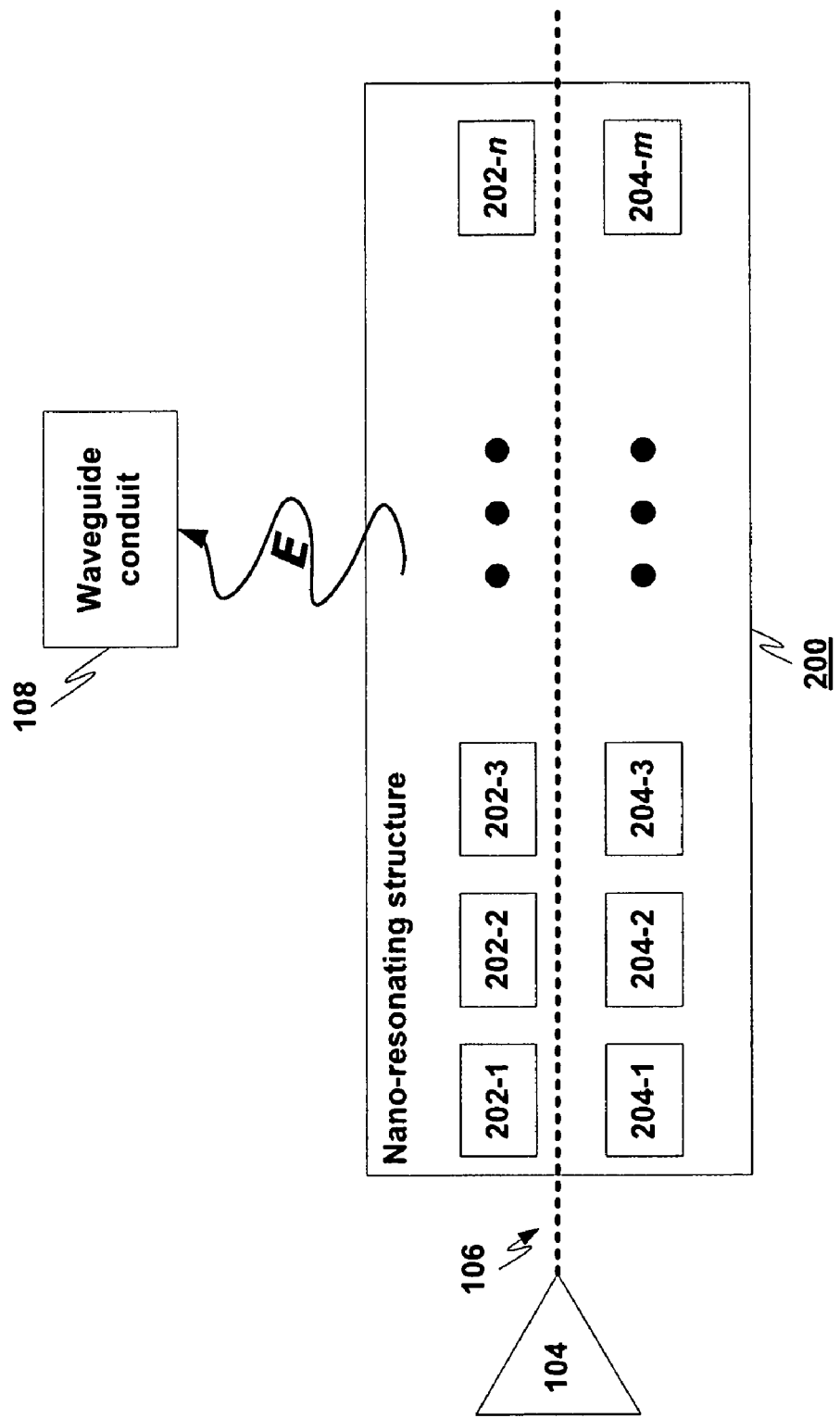

FIG. 2 depicts alternate embodiments of the present invention in which nano-resonant structure 200 consists of a number of component substructures 202-1, 202-2, 202-3, . . . , 202-n, (collectively substructures 202) along with component substructures 204-1, 204-2, 204-3, . . . , 204-m (collectively substructures 204). The two collections of substructures 202, 204 are positioned opposite each other such that a particle beam 106 can pass between them. Although the individual substructures 202 are each shown opposite a corresponding substructure 204, there is no requirement that they be directly opposite each other, and, in some embodiments the two collections of substructures may be offset from each other. Further, although the two collections or rows of substructures 202, 204 are shown in the drawing to be parallel or substantially parallel to each other, there is also no requirement that they be in rows or that they be in parallel rows.

In operation, when the beam 106 passes in proximity to the substructures of nano-resonant structure 100 or nano-resonant structure 200, there is coupling (e.g., capacitive coupling) between various of the substructures. For example, in the embodiments of the form shown in FIG. 1, each substructure 102-j, may capacitively couple with at least one adjacent substructure 102-j+1 (and possibly substructure 102-j−1. In some embodiments, a substructure may capacitively couple with at least two adjacent substructures. There is no requirement that the substructure couple with an immediately adjacent substructure. As the magnetic and electric fields extend out to infinity the coupling can occur between any two or more structures. Magnetic coupling may also occur.

As will be described below, the various substructures that comprise a nano-resonant structure 100, 200, may be formed in different shapes, including C-shaped, rectangular (which includes square shaped and which includes rectangles with rounded corners), semicircular, semi-ovular, or semi-rectangular. The various substructures may have straight and/or rounded edges and/or corners. Each substructure may be at an angle to the electron beam. The substructures can all be the same shape and size, they can be the same shape and of different sizes as each other, or of different shapes and/or sizes as each other.

The nano-resonant structures 100, 200 may be symmetrical or non-symmetrical. There is no requirement that any multiple nano-resonating structures be positioned with any symmetry relating to each other or any other.

Figure 3A:
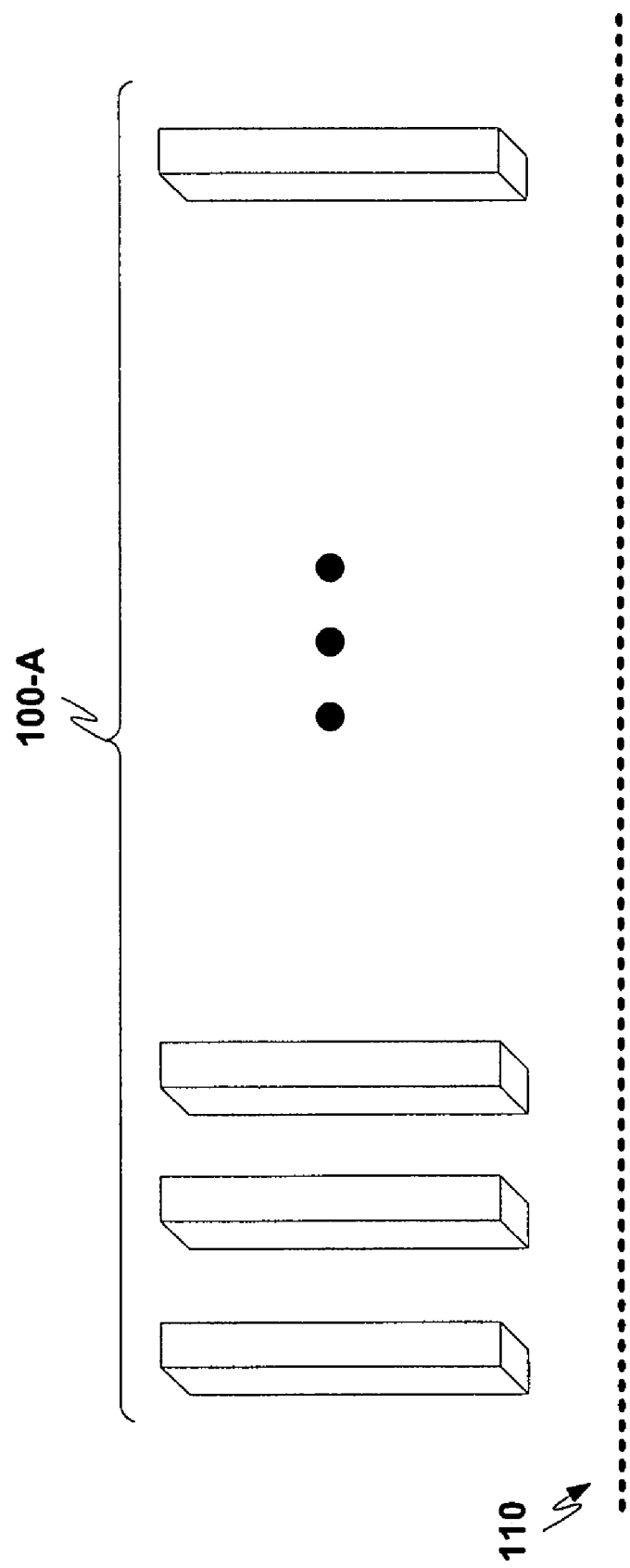
FIGS. 3(a)-3(o) show various coupled nano-resonating energy emitting structures according to embodiments of the present invention.

FIGS. 3(a)-3(o) show various exemplary nano-resonating energy emitting structures according to embodiments of the present invention. The waveguide conduit is omitted from these drawings.

FIG. 3(a) depicts an embodiments of the present invention in which the nano-resonant structure 100-A comprises substructures that are rectangular shaped blocks positioned spaced apart and adjacent to each other. The blocks may all be substantially the same size and shape, or they may be of different sizes. The blocks may be substantially equally spaced, or the inter-block spacing may vary. In the embodiment shown in the drawing, the blocks are substantially perpendicular to a path 110 of a particle beam. The row of rectangular blocks in FIG. 3(a) form a so-called comb structure.

FIGS. 4(a)-4(d) (FIGS. 6, 8, 9, 12, respectively, from related U.S. application Ser. No. 11/243,477) are microscopic photographs of series of exemplary light-emitting comb structures according to embodiments of the present invention as shown in FIGS. 1 and 3(a). The various substructures shown in FIGS. 4(b)-4(c), e.g., are substantially rectangular, with rounded corners.

Figure 3B:
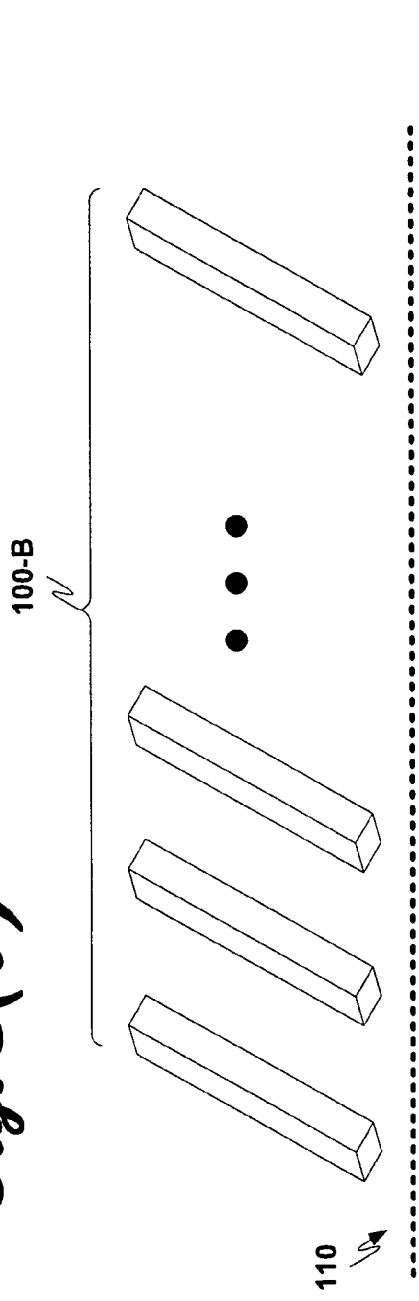
Figure 3C:
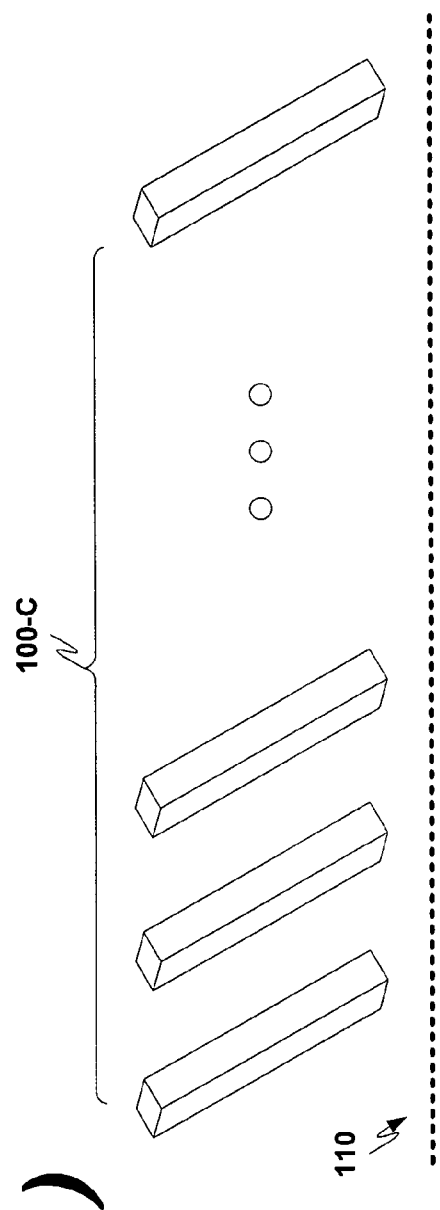

FIGS. 3(b)-3(c) depict embodiments of the present invention similar to those shown in FIG. 3(a). However, in the embodiments shown in FIGS. 3(b)-3(c), some or all of the various subcomponents 100-B and 100-C are positioned at non-right angles relative a path 110 of a particle beam. As with the embodiments of FIG. 3(a), the substructures 100-B and 100-C are substantially rectangular shaped blocks positioned spaced apart and adjacent to each other. The blocks may all be substantially the same size and shape, or they may be of different sizes. The blocks may be substantially equally spaced, or the inter-block spacing may vary. The two rows of rectangular blocks in each of FIGS. 3(b)-3(c) form angled comb structures.

Figure 3D:
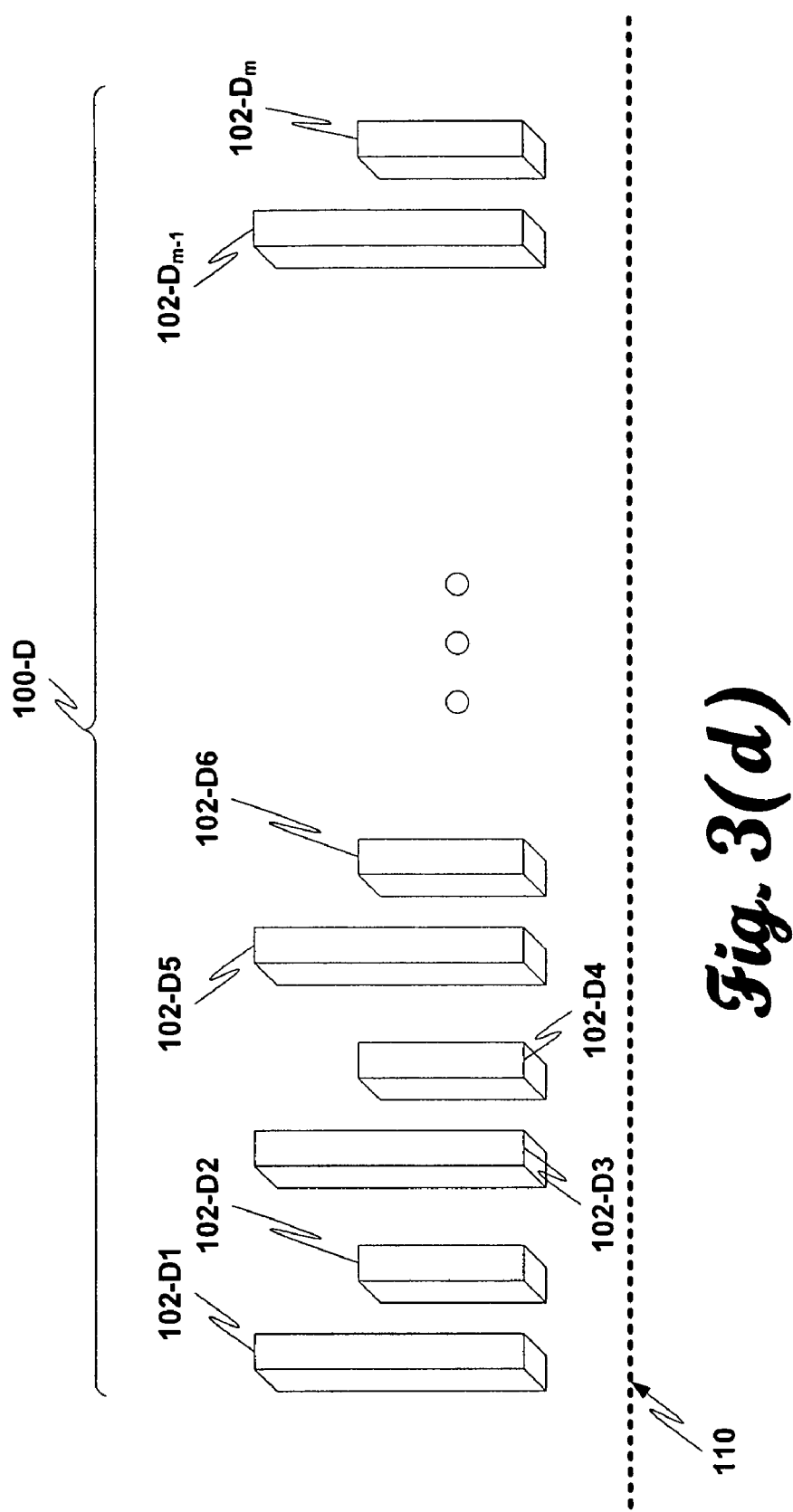

FIG. 3(d) depicts embodiments of the present invention according to FIG. 1, in which the nano-resonant structure 100-D consists of a series of rectangular shaped substructures 102-D1, 102-D2, . . . , 102-D$_{m-1}$, 102-D$_m$, and in which immediately adjacent substructures have different sizes and/or shapes, while alternating substructures are substantially the same size and shape. In this exemplary embodiment, the substructures couple with the immediately adjacent substructures as well as with the alternate substructures. Thus, for example, substructure 102-D1 couples with substructures 102-D3 and 102-D5, etc. as well as with the immediately adjacent substructure 102-D2.

Figure 3E:
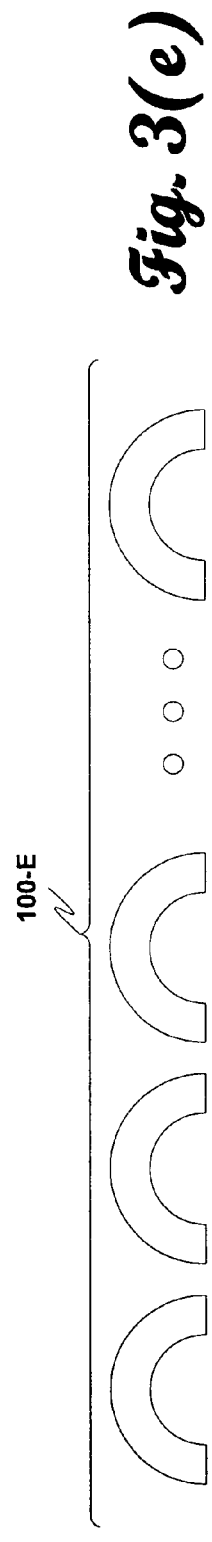
Figure 3F:
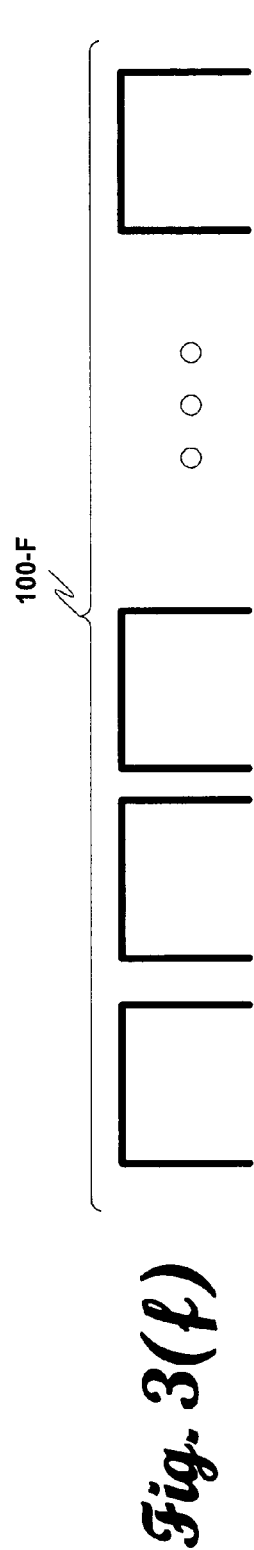
Figure 3G:
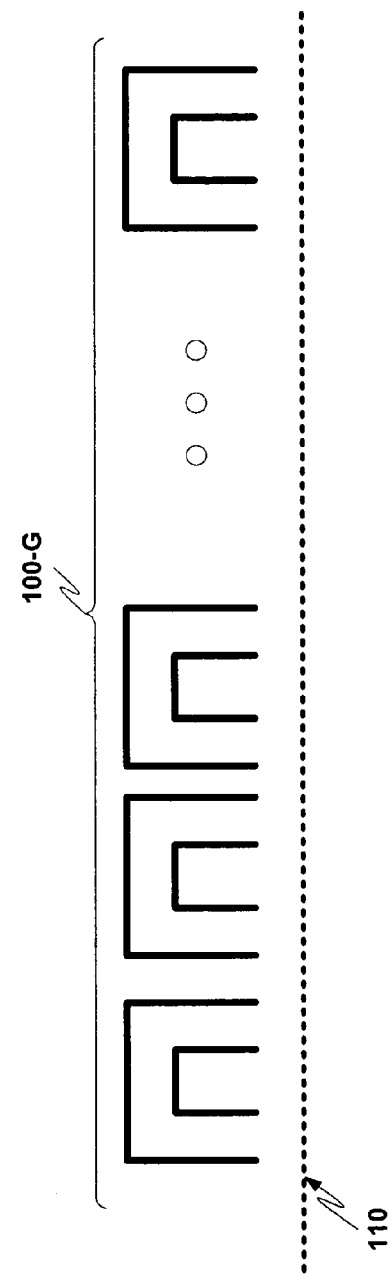

FIGS. 3(e)-3(g) depict embodiments of the present invention as shown in FIG. 1. In the embodiments shown in FIG. 3(e), the substructures 100-E are substantially semi-circular in shape. In the embodiments of FIG. 3(f), each substructure consists of two open rectangular shapes, and in the embodiments of FIG. 3(g), each substructure consists of two open rectangular shapes, one within the other. In the exemplary embodiments shown in FIGS. 3(e)-3(g), the substructures are open in the direction of a path 110 of a particle beam.

Figure 3H:
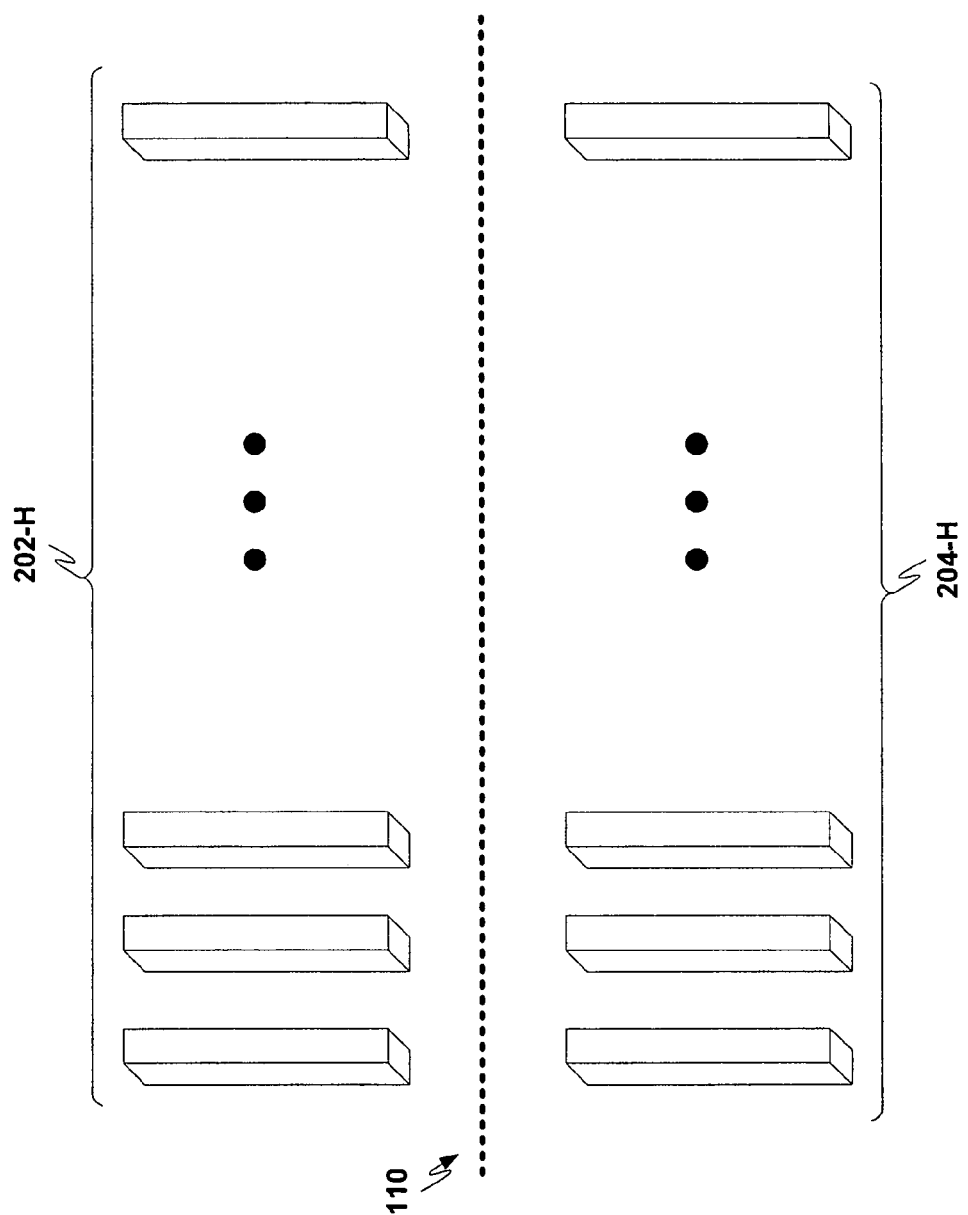
Figure 3I:
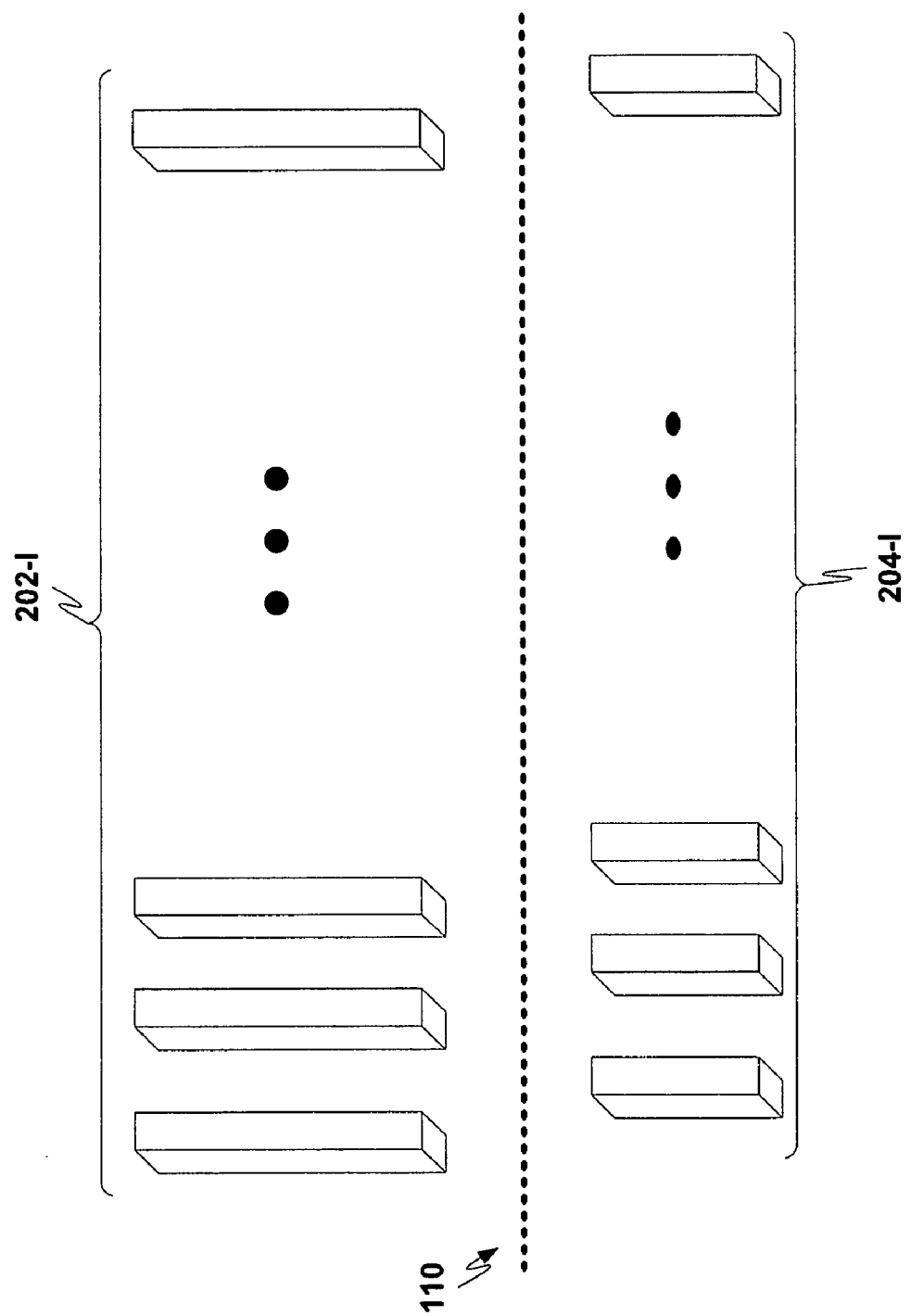

FIG. 3(h) depicts a nano-resonant structure having two rows of substantially rectangular shaped blocks or posts (denoted 202-H, 204-H). This embodiment corresponds to those of FIG. 2. As with the exemplary embodiments shown in FIG. 3(a), the blocks may all be substantially the same size and shape, or they may be of different sizes. The blocks in each row may be substantially equally spaced, or the inter-block spacing may vary. In the embodiment shown in the drawing, the blocks are substantially perpendicular to a path 110 of a particle beam. Further, in the embodiment shown in the drawing, each of the blocks 202-H is substantially opposite a corresponding one of the blocks 204-H. As explained above with reference to FIG. 2, there is no requirement that the blocks 202-H be parallel to the blocks 204-H, nor is there any requirement that each of the blocks 202-H be exactly opposite a corresponding block 204-H. Thus, as shown, e.g., in FIG. 3(i), substructures in the first row, blocks 202-I are not the same size as the substructures (blocks 204-I) in the second row. Furthermore, in the example shown in FIG. 3(i), the blocks in the second row are not each exactly opposite a corresponding block in the first row, instead they are offset.

Figure 5B:
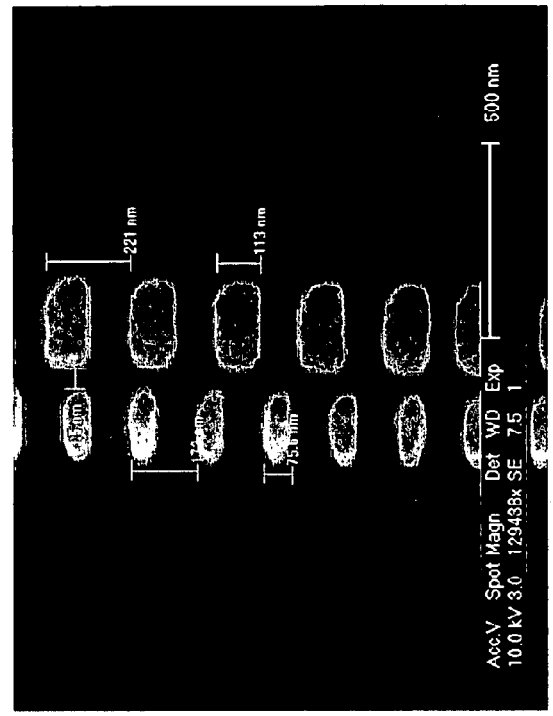
Figure 5A:
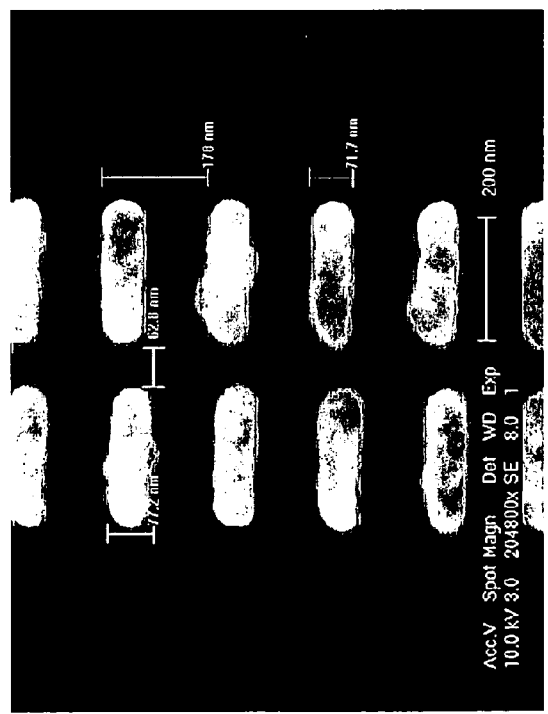
Figure 5C:
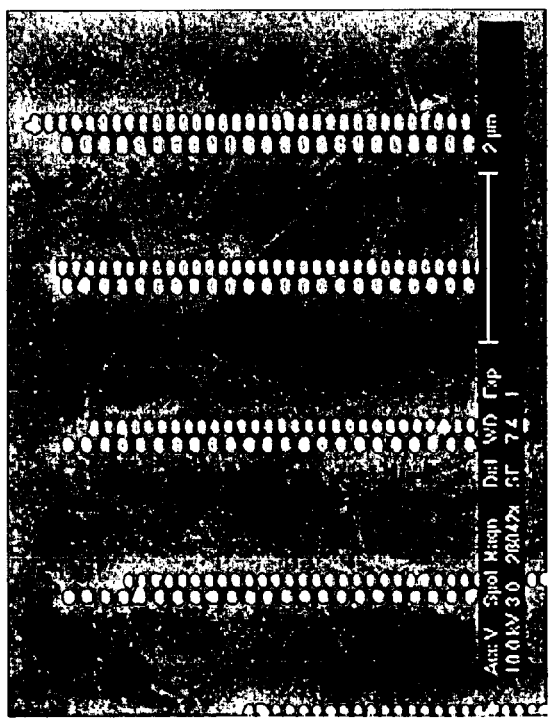
Figure 5D:
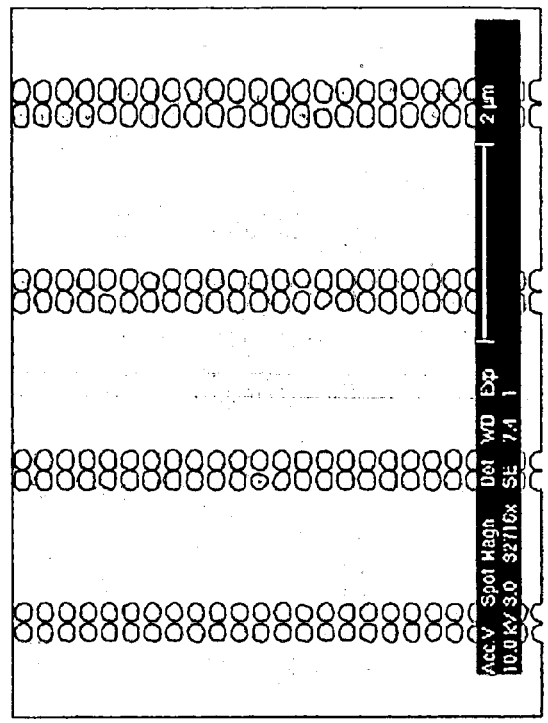
Figure 5E:
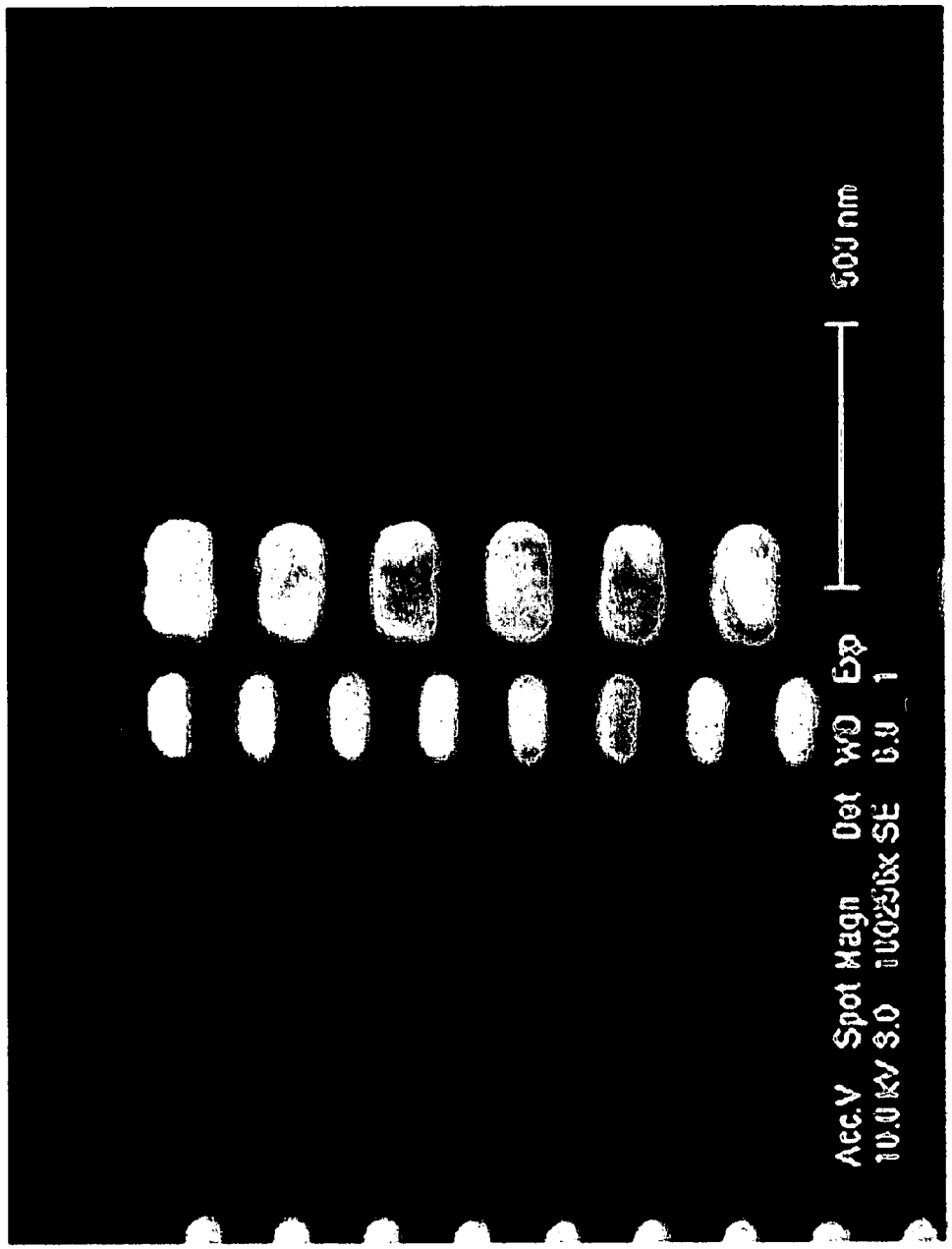
Figure 6D:
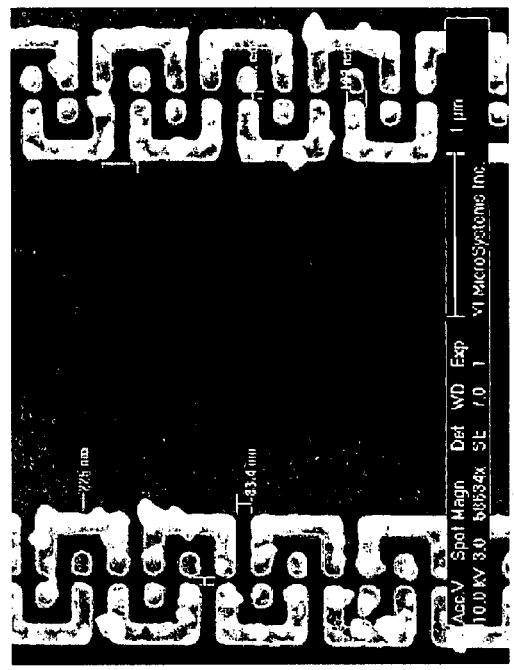
Figure 6C:
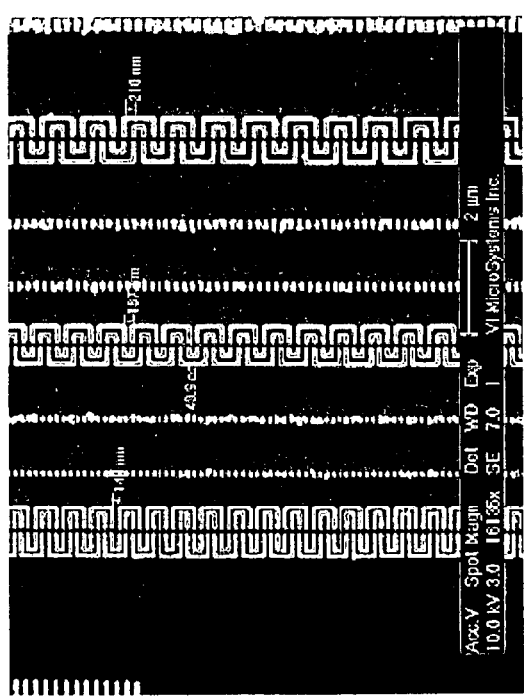

FIGS. 5(a)-5(e) (FIGS. 15, 16, and 18-20, respectively, from related U.S. application Ser. No. 11/243,477) are microscopic photographs of series of substantially parallel rows of nano-resonating energy emitting structures according to embodiments of the present invention. As can be seen from the drawings, the structures on the left side of FIG. 5(a) are substantially parallel and substantially symmetric to those on the right side of the photograph. The structures in FIG. 5(b) are substantially parallel and symmetric, although the structures on the left side of the picture are smaller than those on the right side of the picture and are staggered.

In the exemplary structures of FIG. 5(a), the structures on the both sides of the drawing are substantially rectangular in shape, with dimensions of about 200 nm by 71.7 nm~77.2 nm. The two rows of rectangular nano structures are about 62.8 nm apart. The structures in each row are about 100 nm apart. In the exemplary structures of FIG. 5(b), the structures on the both sides of the drawing are also substantially rectangular in shape. The structures in each row are about 53.5 nm apart. The various substructures shown in FIGS. 5(b)-5(e), e.g., are substantially rectangular, with rounded corners.

Figure 3K:
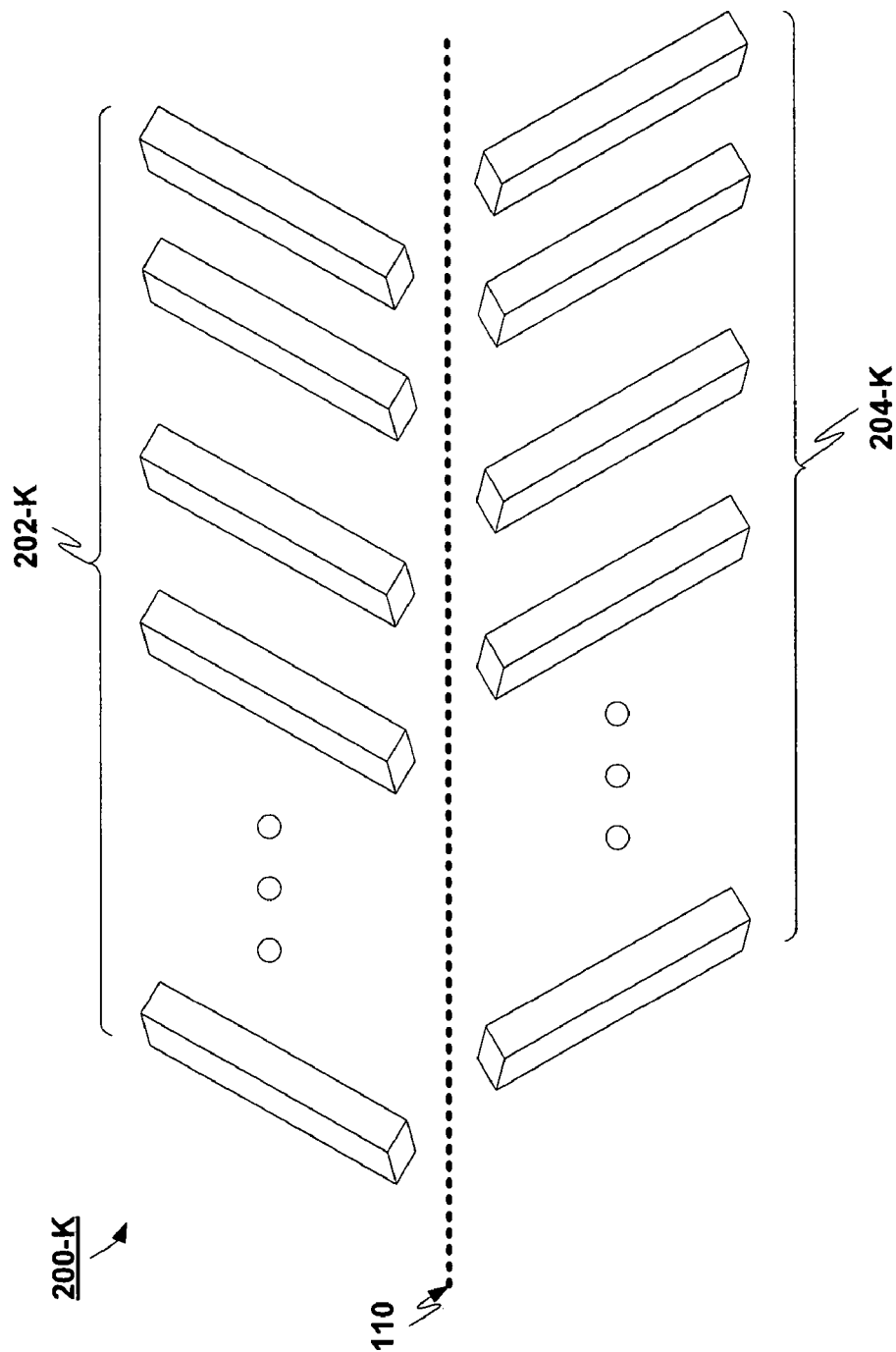
Figure 3N:
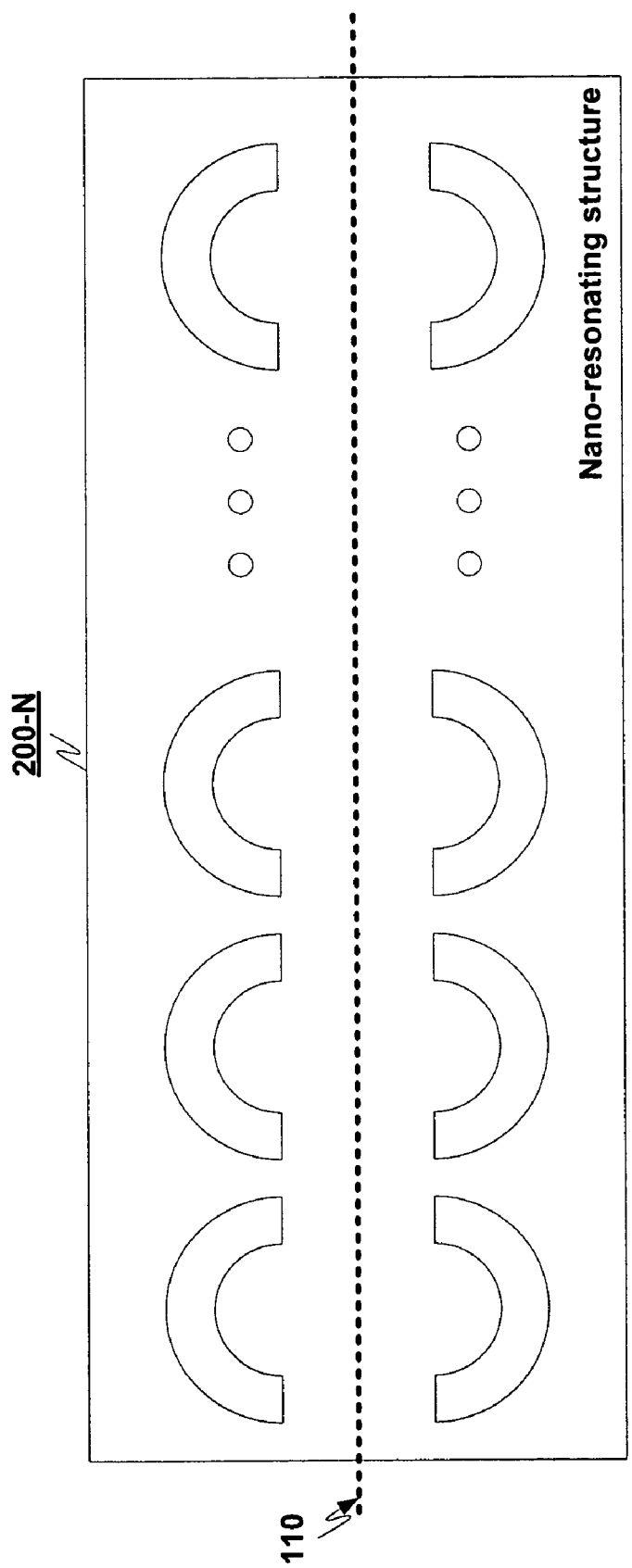
Figure 3A:
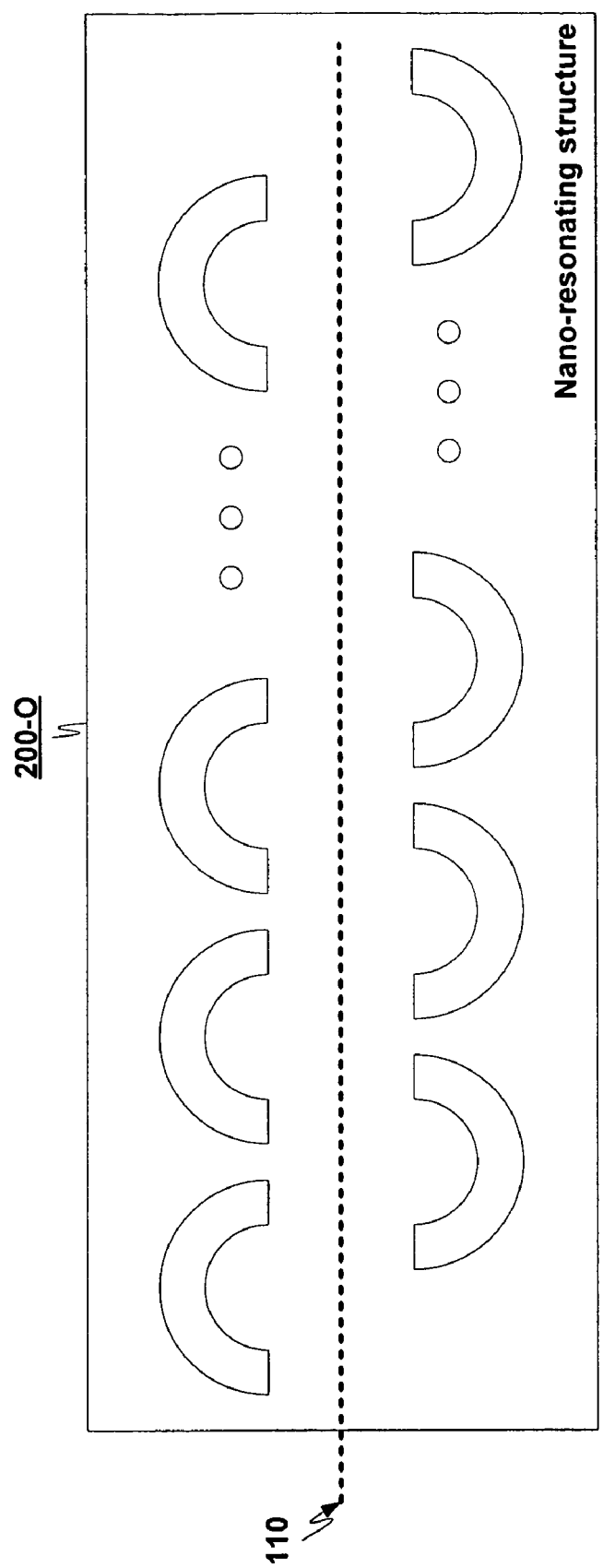
Figure 4A:
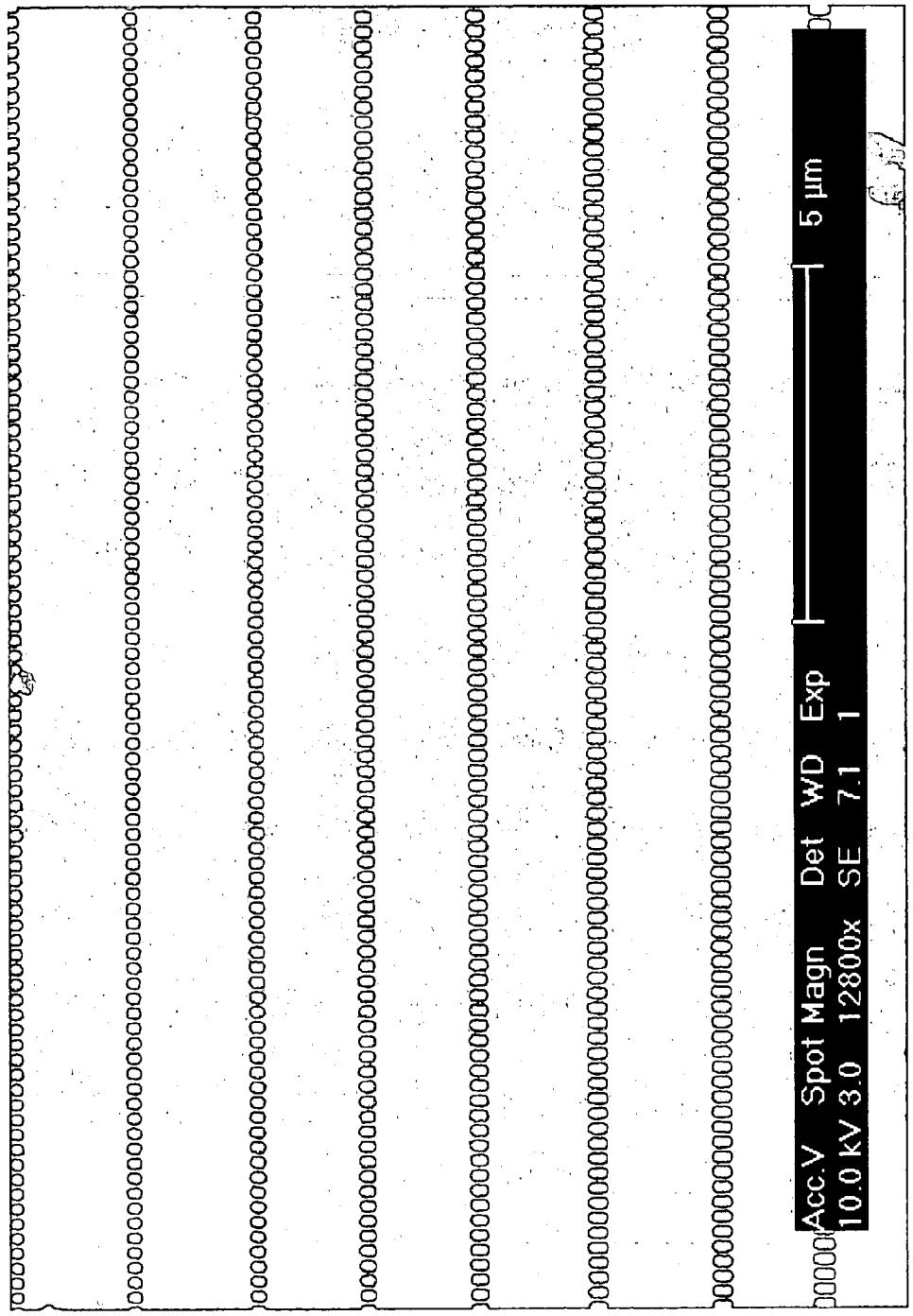
Figure 4B:
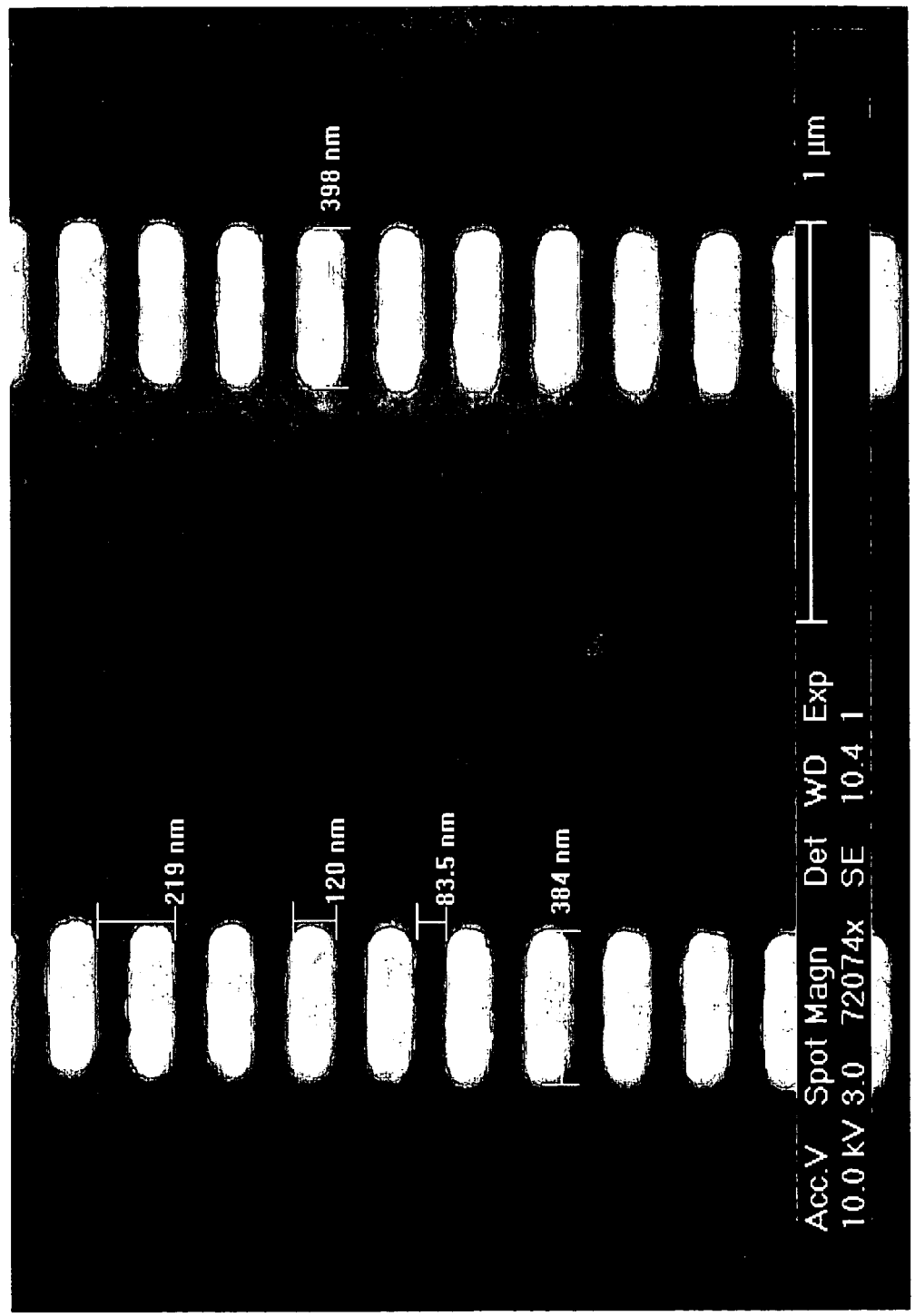
Figure 4C:
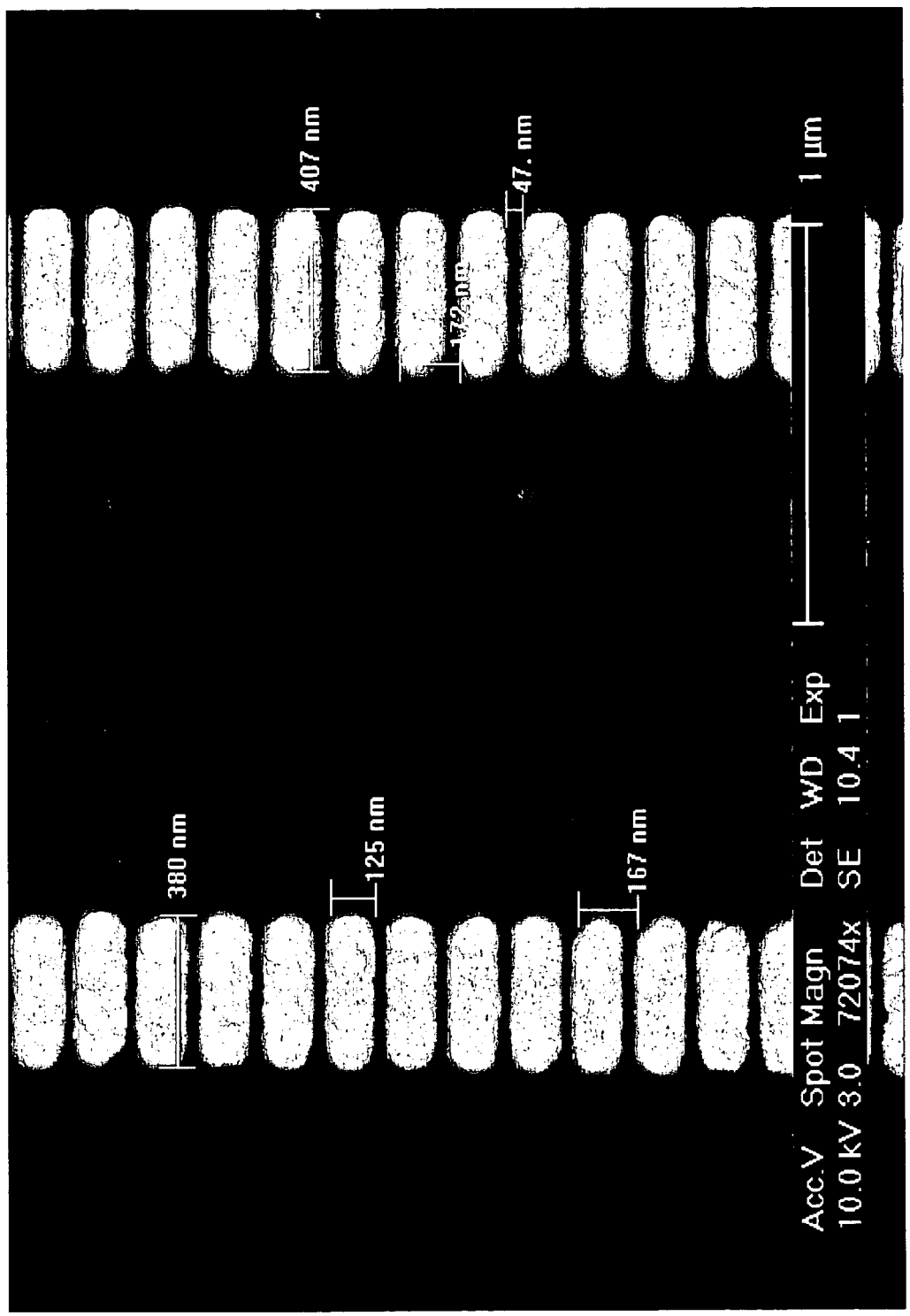
Figure 4D:
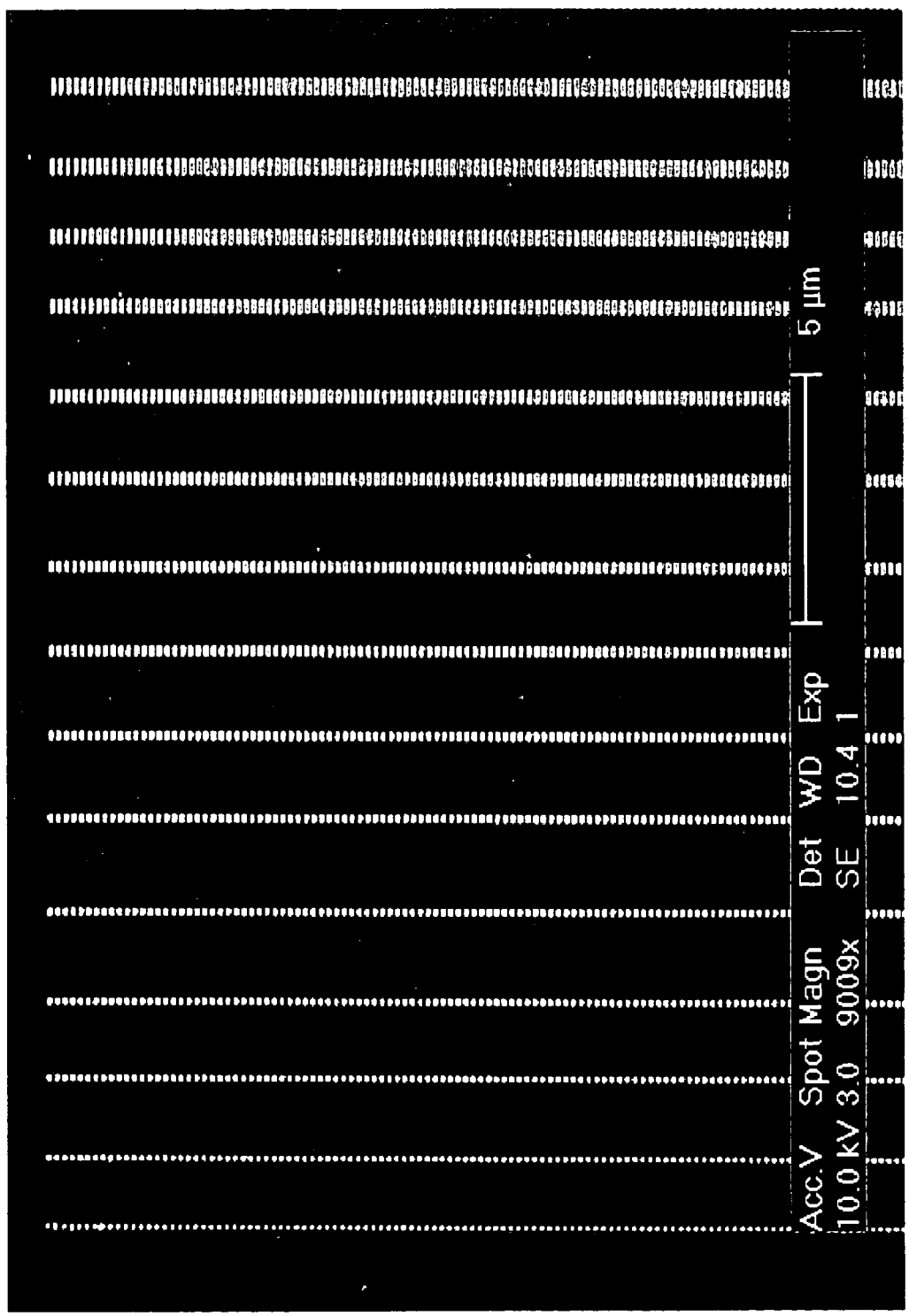

FIG. 3(j) depicts a nano-resonant structure 200-J having two substantially parallel rows of tilted rectangular shaped substructures (denoted 202-J, 204-J), forming a so-called chevron shaped nano-resonant structure. The rows are separated so that a particle beam may be emitted to pass between the two rows or in a path above the two rows. FIG. 3(k) depicts two rows of tilted parallel nano-resonating energy emitting structures as in FIG. 3(j), however, in this embodiment the structures 202-K are offset or staggered relative to the structures 204-K.

Note that for any of these nano-resonant structures shown or described herein, including the nano-resonant structures 200-J and 200-K, in operation the nano-resonant structure may be positioned so that a particle beam passes in either direction along the path shown.

FIGS. 3(l)-3(o) show various other exemplary nano-resonant structures according to embodiments of the present invention.

FIGS. 6(a)-6(d) (FIGS. 21-24, respectively, from related U.S. Patent application Ser. No. 11/243,477) are microscopic photographs of series of nano-resonating energy emitting structures according to embodiments of the present invention.

As can be seen from the various drawings and photographs, the nano-resonating structures can be staggered, symmetric, asymmetric, and angled.

Manufacture

Nano-resonating structures 100, 200 can be constructed with many types of materials. Examples of suitable fabrication materials include silver, high conductivity metals, and high temperature superconducting materials. The material may be opaque or semi-transparent. In the above-identified patent applications, ultra-small structures for producing electromagnetic radiation are disclosed, and methods of making the same. In at least one embodiment, the resonant structures of the present invention are made from at least one layer of metal (e.g., silver, gold, aluminum, platinum or copper or alloys made with such metals); however, multiple layers and non-metallic structures (e.g., carbon nanotubes and high temperature superconductors) can be utilized, as long as the structures are excited by the passage of a charged particle beam. The materials making up the resonant structures may be deposited on a substrate and then etched, electroplated, or otherwise processed to create a number of individual resonant elements. The material need not even be a contiguous layer, but can be a series of resonant elements individually present on a substrate. The materials making up the resonant elements can be produced by a variety of methods, such as by pulsed-plating, depositing or etching. Preferred methods for doing so are described in co-pending U.S. application Ser. No. 10/917,571, filed on Aug. 13, 2004, entitled "Patterning Thin Metal Film by Dry Reactive Ion Etching," and in U.S. application Ser. No. 11/203,407, filed on Aug. 15, 2005, entitled "Method Of Patterning Ultra-Small Structures," both of which are commonly owned at the time of filing, and the entire contents of each of which are incorporated herein by reference.

Various photographs show exemplary dimensions for the structures and their respective spacing. Those skilled in the art will realize that these dimensions are merely exemplary and are not intended to limit the scope of the invention in any way. While the invention is not to be limited by the dimensions and spacing of the various nano-resonant structures, the dimensions and relative positions of various exemplary nano-resonant structures according to embodiments of the present invention can be seen in the various photographs of FIGS. 4(a)-4(d), 5(a)-5(e), and 6(a)-6(d).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. A coupled nano-resonating structure comprising:
a plurality of a nano-resonating substructures constructed and adapted to couple energy from a beam of charged particles into said nano-resonating structure and to transmit the coupled energy outside said nano-resonating structure.

2. The nano-resonating energy structure of claim 1 wherein said plurality of a nano-resonating substructures are positioned adjacent each other in a substantially straight row.

3. The nano-resonant structure of claim 2 wherein each of said plurality of nano-resonating substructures has a shape selected from the group comprising:
C-shaped; semi-circular shaped; semi-ovular shaped; semi-rectangular shaped; and rectangular shaped.

4. The nano-resonant structure of claim 3 wherein all of the plurality of nano-resonant substructures have substantially the same shape.

5. The nano-resonant structure of claim 4 wherein all of the plurality of nano-resonant substructures have substantially the same dimensions.

6. The nano-resonant structure of claim 2 wherein said plurality of nano-resonant substructures are substantially equally spaced apart.

7. The nano-resonant structure of claim 1 wherein the nano-resonant structure is formed on a single substrate.

8. The nano-resonating energy structure of claim 1 wherein said plurality of a nano-resonating substructures are positioned adjacent each other in at least two substantially straight rows.

9. The nano-resonant structure of claim 8 wherein each of said plurality of nano-resonating substructures has a shape selected from the group comprising:
C-shaped; semi-circular shaped; semi-ovular shaped; semi-rectangular shaped; and rectangular shaped.

10. The nano-resonant structure of claim 9 wherein all of the plurality of nano-resonant substructures have substantially the same shape.

11. The nano-resonant structure of claim 8 wherein all of the plurality of nano-resonant substructures have substantially the same dimensions.

12. The nano-resonant structure of claim 2 wherein said plurality of nano-resonating substructures in at least one of the rows are substantially equally spaced apart from each other.

13. The nano-resonant structure of claim 2 comprising two substantially parallel rows, each comprising some of said plurality of nano-resonant substructures.

14. The nano-resonant structure of claim 13 wherein at least some of the nano-resonant substructures in a first of the two rows are positioned substantially opposite at least some of the nano-resonant substructures in a second of the two rows.

15. The nano-resonant structure of claim 13 wherein a first of the two rows has a different number of nano-resonant substructures from a second of the two rows.

16. The nano-resonant structure of claim 13 wherein each of the two rows has the same number of nano-resonant substructures.

17. The nano-resonant structure of claim 14 wherein the nano-resonant substructures in a first of the two rows have different dimensions from the nano-resonant substructures in a second of the two rows.

18. The nano-resonant structure as in claim 1 wherein the of charged particles are selected from the group comprising: electrons, protons, and ions.

19. The nano-resonant structure of claim 8 wherein the two rows of structures are symmetric.

20. The nano-resonant structure of claim 8 wherein the two rows of structures are asymmetric.

21. The nano-resonant structure of claim 1 wherein the nano-resonant substructures are composed of one from the group of: metals, alloys, non-metallic conductors and dielectrics.

22. A coupled nano-resonating structure comprising:

a plurality of a nano-resonating substructures constructed and adapted to couple energy from a beam of charged particles into said nano-resonating structure and to transmit the coupled energy outside said nano-resonating structure, said plurality of a nano-resonating substructures being positioned adjacent each other in a substantially straight row, and wherein each of said plurality of nano-resonating substructures has a shape selected from the group comprising: C-shaped; semi-circular shaped; semi-ovular shaped; semi-rectangular shaped; and rectangular shaped, wherein the nano-resonant structure is on a single substrate, and wherein the nano-resonant substructures are composed of one from the group of: metals, alloys, non-metallic conductors and dielectrics, and wherein the charged particles are selected from the group comprising: electrons, protons, and ions.

23. A coupled nano-resonating structure comprising:

a plurality of a nano-resonating substructures constructed and adapted to couple energy from a beam of charged particles into said nano-resonating structure and to transmit the coupled energy outside said nano-resonating structure, said plurality of a nano-resonating substructures being positioned adjacent each other in two substantially straight rows, wherein each of said plurality of nano-resonating substructures has a shape selected from the group comprising: C-shaped; semi-circular shaped; semi-ovular shaped; semi-rectangular shaped; and rectangular shaped, wherein the nano-resonant structure is on a single substrate, and wherein the nano-resonant substructures are composed of one from the group of: metals, alloys, non-metallic conductors and dielectrics, and wherein the charged particles are selected from the group comprising: electrons, protons, and ions.

24. The nano-resonant structure of claim 23 wherein said plurality of nano-resonating substructures in at least one of the rows are substantially equally spaced apart from each other.

25. The nano-resonant structure of claim 23 wherein at least some of the nano-resonant substructures in a first of the two rows are positioned substantially opposite at least some of the nano-resonant substructures in a second of the two rows.

26. The nano-resonant structure of claim 23 wherein the two rows of structures are symmetric.

27. The nano-resonant structure of claim 23 wherein the two rows of structures are asymmetric.

* * * * *